(12) United States Patent
Kozakai et al.

(10) Patent No.: US 9,773,634 B2
(45) Date of Patent: Sep. 26, 2017

(54) IRIDIUM TIP, GAS FIELD ION SOURCE, FOCUSED ION BEAM APPARATUS, ELECTRON SOURCE, ELECTRON MICROSCOPE, ELECTRON BEAM APPLIED ANALYSIS APPARATUS, ION-ELECTRON MULTI-BEAM APPARATUS, SCANNING PROBE MICROSCOPE, AND MASK REPAIR APPARATUS

(71) Applicant: Hitachi High-Tech Science Corporation, Minato-ku, Tokyo (JP)

(72) Inventors: Tomokazu Kozakai, Tokyo (JP); Osamu Matsuda, Tokyo (JP); Yasuhiko Sugiyama, Tokyo (JP); Kazuo Aita, Tokyo (JP); Fumio Aramaki, Tokyo (JP); Anto Yasaka, Tokyo (JP); Hiroshi Oba, Tokyo (JP)

(73) Assignee: Hitachi High-Tech Science Corporation, Minato-ku, Tokyo (JP)

( * ) Notice: Subject to any disclaimer, the term of this patent is extended or adjusted under 35 U.S.C. 154(b) by 0 days.

(21) Appl. No.: 15/416,686

(22) Filed: Jan. 26, 2017

(65) Prior Publication Data
US 2017/0148603 A1 May 25, 2017

Related U.S. Application Data

(62) Division of application No. 14/455,338, filed on Aug. 8, 2014, now Pat. No. 9,583,299.

(30) Foreign Application Priority Data

Aug. 9, 2013 (JP) .................................. 2013-167130
Jul. 16, 2014 (JP) .................................. 2014-146186

(51) Int. Cl.
*H01J 37/304* (2006.01)
*G01Q 60/10* (2010.01)
(Continued)

(52) U.S. Cl.
CPC ............ *H01J 1/3044* (2013.01); *G01Q 60/16* (2013.01); *G01Q 70/08* (2013.01); *H01J 37/073* (2013.01);
(Continued)

(58) Field of Classification Search
CPC ...... H01J 37/304; H01J 37/3044; H01J 37/08; G01Q 60/10; G01Q 60/24; G01Q 70/10; G01Q 70/14
See application file for complete search history.

(56) References Cited

U.S. PATENT DOCUMENTS

| 4,486,684 A | 12/1984 | Hohn |
| 6,235,413 B1 | 5/2001 | Dosaka et al. |

(Continued)

FOREIGN PATENT DOCUMENTS

| JP | 2006-189276 A | 7/2006 |
| JP | 2008-239376 A | 10/2008 |
| JP | 2009-107105 A | 5/2009 |

OTHER PUBLICATIONS

William B. Thompson et al., Proceedings of the 28th Annual LSI Testing Symposium (LSITS 2008), (2008) pp. 249-254, "The Helium Ion Microscope for Semiconductor Device Imaging and Failure Analysis Applicatons".

(Continued)

*Primary Examiner* — Sean Luck
(74) *Attorney, Agent, or Firm* — Banner & Witcoff, Ltd.

(57) ABSTRACT

There is provided an iridium tip including a pyramid structure having one {100} crystal plane as one of a plurality of pyramid surfaces in a sharpened apex portion of a single crystal with <210> orientation. The iridium tip is applied to a gas field ion source or an electron source. The gas field ion source and/or the electron source is applied to a focused ion beam apparatus, an electron microscope, an electron beam (Continued)

applied analysis apparatus, an ion-electron multi-beam apparatus, a scanning probe microscope or a mask repair apparatus.

11 Claims, 13 Drawing Sheets

(51) Int. Cl.
    *H01J 37/08* (2006.01)
    *H01J 1/304* (2006.01)
    *H01J 37/073* (2006.01)
    *H01J 37/21* (2006.01)
    *H01J 37/28* (2006.01)
    *G01Q 60/16* (2010.01)
    *G01Q 70/08* (2010.01)
    *H01J 37/30* (2006.01)

(52) U.S. Cl.
    CPC ............. *H01J 37/08* (2013.01); *H01J 37/21* (2013.01); *H01J 37/28* (2013.01); *H01J 37/3002* (2013.01); *H01J 2201/30415* (2013.01); *H01J 2237/002* (2013.01); *H01J 2237/006* (2013.01)

(56) References Cited

U.S. PATENT DOCUMENTS

| | | |
|---|---|---|
| 7,431,856 B2 | 10/2008 | Rezeq et al. |
| 7,737,414 B2 | 6/2010 | Kuo et al. |
| 2006/0093306 A1 | 5/2006 | Kawasaki et al. |
| 2007/0134829 A1 | 6/2007 | Wilke et al. |
| 2008/0116927 A1 | 5/2008 | Dozier et al. |
| 2009/0110951 A1 | 4/2009 | Kuo et al. |
| 2009/0183617 A1 | 7/2009 | Ito et al. |
| 2010/0219339 A1 | 9/2010 | Ogawa et al. |
| 2011/0215256 A1* | 9/2011 | Ogawa ............... H01J 3/14 250/396 R |
| 2012/0068067 A1* | 3/2012 | Scipioni ............. H01J 37/08 250/307 |
| 2013/0248483 A1 | 9/2013 | Sugiyama et al. |

OTHER PUBLICATIONS

B.W. Ward et al., Journal of Vacuum Science & Technology, vol. 24, (2006), pp. 2871-2874, "Helium ion microscope: A new tool for nanoscale microscopy and metrology".

Ivan Ermanoski et al., Surf, Sci. vol. 596, (2005), pp. 89-97, "Atomic structure of O/Ir (210) nanofacets".

Hong-Shi Kuo et al., Nanotechnology, vol. 20, (2009) No. 335701, "A Single-atom sharp iridium tip as an emitter of gas field ion sources".

Ivan Ermanoski et al., Surf, Sci. vol. 549, (2004), pp. 1-23, "Oxygen-induced nano-faceting of IR(210)".

* cited by examiner

FIG.15A
FIG.15B
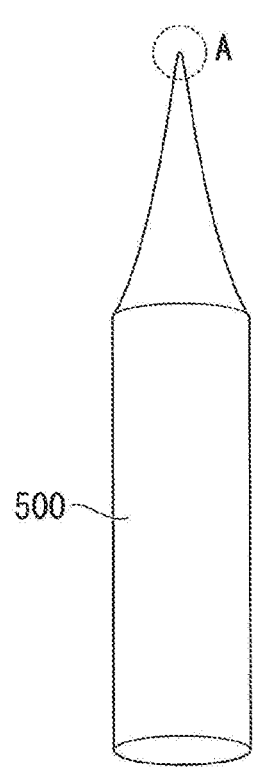
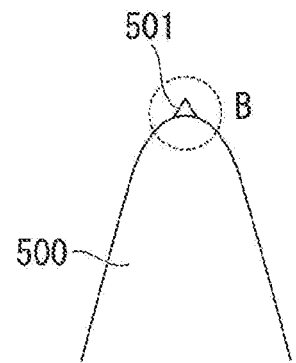
FIG.15C
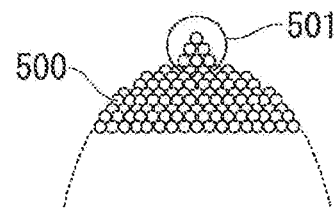

TABLE 1

| Number of atoms / Layer | Arrangement and number of atoms in each layer | | |
|---|---|---|---|
| | Present application (Fig. 5) | Conventional example (Fig. 7) | Conventional example (Fig. 8) |
| First layer (apex) | ○  1 atom | ○  1 atom | ○  1 atom |
| Second layer | ○ ○ ○  3 atoms | ○ ○ ○  3 atoms | ○ ○ ○ ○ ○ ○  6 atoms |
| Third layer | ○ ○ ○ ○ ○ ○  6 atoms | ○ ○ ○ ○ ○ ○ ○ ○ ○ ○  10 atoms | ○ ○ ○ ○ ○ ○ ○ ○ ○ ○ ○ ○ ○ ○ ○  15 atoms |

*FIG. 16*

IRIDIUM TIP, GAS FIELD ION SOURCE, FOCUSED ION BEAM APPARATUS, ELECTRON SOURCE, ELECTRON MICROSCOPE, ELECTRON BEAM APPLIED ANALYSIS APPARATUS, ION-ELECTRON MULTI-BEAM APPARATUS, SCANNING PROBE MICROSCOPE, AND MASK REPAIR APPARATUS

CROSS-REFERENCE TO RELATED APPLICATION

This application in a divisional of U.S. patent application Ser. No. 14/455,338 filed Aug. 8, 2014, which claims priority from Japanese Patent Application No. 2013-167130, filed on Aug. 9, 2013 and Japanese Patent Application No. 2014-146186, filed on Jul. 16, 2014, the entire subject matter of which is incorporated herein by reference.

TECHNICAL FIELD

The present invention relates to an iridium tip, a gas field ion source, a focused ion beam apparatus, an electron source, an electron microscope, an electron beam applied analysis apparatus, an ion-electron multi-beam apparatus, a scanning probe microscope, and a mask repair apparatus.

BACKGROUND

Hereinafter, a sharpened needle-like electrode which generates electrons or ions in an electron source of an electron microscope or a gas field ion source (GFIS) of a focused ion beam (FIB) apparatus, a probe in a scanning probe microscope (SPM), or the like is referred to as a "tip".

Conventionally, in order to obtain a high resolution image in an electron microscope and a focused ion beam apparatus, the apex of a tip has been desired to be sharpened in a level of several atoms. Further, in order to prolong the lifetime of a tip in a scanning probe microscope, the apex of a tip has been desired to be sharpened to an atomic level.

FIGS. 15A to 15C show a schematic shape of a conventional tip 500. As shown in FIG. 15A, the tip 500 is formed such that the tip end of a fine wire having a diameter of several hundreds of micrometers or less has a narrow and sharp shape by electrolytic polishing (also referred to as "wet etching"). As shown in FIG. 15B, the tip 500 has a minute protrusion 501 in the apex portion B. As shown in FIG. 15C, the protrusion 501 has a triangular pyramid shape formed by several atomic layers, and the apex of the protrusion 501 is constituted by a single atom. Hereinafter, the protrusion 501 is referred to as a "pyramid structure".

Incidentally, there has been known an ion microscope which includes a gas field ion source using a tungsten tip. In the tip, a crystal plane with a low planar atomic density tends to be sharpened, and therefore, the tungsten tip is sharpened in the <111> direction. The {111} crystal plane of tungsten has a threefold rotational symmetry, and a {110} crystal plane or a {112} crystal plane composes a side surface (pyramid surface) of a pyramid structure.

As a method for sharpening the apex of the tungsten tip in a level of several atoms, there has been known a method such as field-induced gas etching using nitrogen or oxygen, thermal faceting, or remolding, and by those methods, the apex in the <111> direction can be sharpened with high reproducibility.

The field-induced gas etching is a method for etching a tungsten tip by introducing nitrogen gas while observing a Field Ion Microscope (FIM) image using helium or the like as an imaging gas in an FIM. The ionization field strength of nitrogen is lower than that of helium, and therefore, nitrogen gas cannot come closer to a region where the FIM image can be observed (that is, a region where helium is field-ionized) and is adsorbed on the side surface of the tip at a short distance away from the apex of the tungsten tip. Then, the nitrogen gas is bonded to a tungsten atom on the surface of the tip to form tungsten nitride. Tungsten nitride has low evaporation field strength, and therefore, only the side surface of the tip at a short distance away from the apex on which nitrogen gas is adsorbed is selectively etched. At this time, a tungsten atom at the apex of the tungsten tip is not etched, and therefore, a tip having a further sharpened apex than an electrolytically polished tip can be obtained (for example, U.S. Pat. No. 7,431,856B).

The thermal faceting is a method for forming a polyhedral structure at the apex of a tip by heating the tip after electrolytic polishing in an oxygen atmosphere to grow a specific crystal plane (for example, JP2009-107105A).

The remolding is a method for forming a crystal plane at the apex of a tip by heating and applying a high voltage to the tip after electrolytic polishing under ultrahigh vacuum conditions (for example, JP2008-239376A).

Further, as a method for forming a tip having a structure in which the apex of the tip is constituted by a single atom, there has been known a method in which the surface of a tungsten or molybdenum tip is plated with gold, platinum, palladium, iridium, rhodium, or an alloy thereof, and then, the tip is terminated with a single atom by electrolytic polishing or heating (for example, JP2006-189276A).

Further, there has been known a scanning ion microscope (i.e. a focused ion beam apparatus) using a focused helium ion beam which includes a gas field ion source using a tungsten tip (for example, William B. Thompson et al., Proceedings of the 28th Annual LSI Testing Symposium (LSITS 2008), (2008) pp. 249-254, "Helium Ion Microscope for Semiconductor Device Imaging and Failure Analysis Applications").

Further, it has been known that in a scanning ion microscope using a focused helium ion beam which includes a gas field ion source using a tungsten tip, the apex of the tungsten tip which emits ions is terminated with a trimer composed of three tungsten atoms (for example, B. W. Ward et al., Journal of Vacuum Science & Technology, vol. 24, (2006), pp. 2871-2874, "Helium ion microscope: A new tool for nanoscale microscopy and metrology").

Further, it has been known that in order to form a tip having a pyramid structure in which the apex of a fine wire is constituted by a single atom with iridium having higher chemical resistance than tungsten as a material of the tip, it is essential to perform heating (thermal faceting) while introducing oxygen into a vacuum vessel (for example, JP2009-107105A).

Further, it has been known that a minute triangular pyramid structure composed of one {110} crystal plane and two {311} crystal planes is formed at the apex of a <210> iridium single crystal tip (for example, Ivan Ermanoski et al., Surf. Sci. vol. 596, (2005), pp. 89-97, "Atomic structure of O/Ir (210) nanofacets").

Further, it has been known that a minute triangular pyramid composed of one {110} crystal plane and two {311} crystal planes is formed by thermal faceting at the apex of a sharpened <210> iridium single crystal tip, and the apex thereof is constituted by a single atom. A gas field ion source using this iridium tip can continuously emit a beam for about 2,250 seconds (for example, Hong-Shi Kuo et al., Nanotechnology, vol. 20, (2009) No. 335701, "A Single-atom sharp iridium tip as an emitter of gas field ion sources").

SUMMARY (With Respect to Tungsten Tip)

Incidentally, the tungsten tip to be used in the gas field ion source according to the above-described conventional technique has an apex constituted by three atoms called "trimer" and simultaneously emits three beams from these three atoms. An electron microscope or a focused ion beam apparatus including this gas field ion source selects, from among the three beams emitted from the tungsten tip, one beam with an aperture disposed in an ion beam path, focuses the beam, and irradiates the beam on a sample. Therefore, a beam current reaching the sample is decreased to at least ⅓ of the total beam current. Further, even if the sum of the total ion emission current of three beams emitted from the apex of the tip is constant, the balance of the amount of the ion current emitted from each of the three atoms may be unstable. A decrease in beam current causes problems that the image quality is decreased in forming an image, and the processing amount is decreased in performing processing. Therefore, with the use of such a tungsten tip terminated with three atoms, a processing shape and an observation image may be unstable.

Further, when a process such as heating is performed for the apex of a tungsten tip in a vacuum ion chamber, a residual gas in the vacuum chamber, particularly oxygen or nitrogen tends to be adhered to the surface of the tungsten tip. When oxygen or nitrogen is adhered to the surface of the tungsten tip, a reaction is caused to form tungsten oxide or tungsten nitride having a low evaporation field strength. A damage caused by the field evaporation of such an oxide or a nitride from the surface of the tungsten tip at a low field strength may proceed. A small amount of oxygen or nitrogen is used in a sharpening process of the tungsten tip, and therefore, the formation of an oxide or a nitride on the surface of the tungsten tip cannot be avoided, and if the apex of the tungsten tip is damaged, the generated ion current may vary, and moreover, ion emission may be stopped. Further, if the apex of the tungsten tip is damaged, it is necessary to perform a sharpening process again, and a problem arises that the downtime of the apparatus including this tungsten tip is increased. In view of such problems, helium gas is introduced into an ion source chamber so as to emit helium ions from a gas field ion source including the tungsten tip. However, in this case, a pure gas, which is expensive, is needed, and a problem arises that the cost is increased.

(With Respect to Method for Sharpening Iridium Tip)

In view of the problem that the tungsten tip has an apex constituted by three atoms at the apex, it is considered that iridium is used as a material which enables the formation of an apex constituted by a single atom and has higher chemical resistance than tungsten.

However, the inventors of the present application have found that in a finishing process for sharpening the apex of the iridium tip, it is difficult to form a desired shape (that is, a pyramid structure having an apex constituted by a single atom) at a desired position by merely using a conventional technique.

Further, the {210} crystal plane of iridium has a low planar atomic density and tends to be sharpened, and therefore, the iridium tip is sharpened in the <210> direction. As shown in FIG. 4, when viewing the {210} crystal plane of iridium from the front, the crystal has mirror image symmetry with respect to a plane containing the <110> axis and the <210> axis. Therefore, when nitrogen etching is performed, a portion in the vicinity of the boundary surface between the {210} crystal plane and the {310} crystal plane is left. However, since the {310} plane has a rectangular shape, an odd number of atoms are not left. That is, in the case of iridium, it is difficult to perform formation at a desired position in a state where the number of terminal atoms is decreased such as a trimer and the like. Further, when the final sharpening finishing process is performed only by field evaporation, several atomic layers in the apex portion are field-evaporated at once in a block state in many cases, and it is difficult to form a desired apex at the apex.

Further, as a method for sharpening the iridium tip, in the case of introducing oxygen gas in field-induced gas etching, which is a conventional method, a problem arises that since iridium has higher chemical resistance than tungsten, a time required for the processing is increased as compared with the case where tungsten is processed. Incidentally, in the case where nitrogen gas is introduced in place of introducing oxygen gas, a protrusion structure similar to that of tungsten can be formed at the apex of the tip. However, it is necessary to increase the pressure of nitrogen to be introduced and also the etching speed is decreased as compared with the case of tungsten, and therefore, a problem arises that a time required for the processing is increased.

Further, when the iridium tip is sharpened by field-induced gas etching, an apex is sometimes formed at a position other than the desired position, and it has been found by an experiment made by the inventors of the present application that it is difficult to form a pyramid structure at the same atomic position at each processing with high reproducibility. If the reproducibility of the position of the tip apex is unstable, the position of emission of ions or electrons varies at each processing for forming the apex. Therefore, a problem arises that it is necessary to adjust the position of an ion source or an electron source each time so as to align the beam in an electron microscope or a focused ion beam apparatus with the optical axis with high accuracy, and thus, the conventional method is not preferred from the practical viewpoint.

Incidentally, by thermal faceting of the iridium tip in an oxygen atmosphere (forming a low-index crystal plane), the tip in the <210> direction can be sharpened with high reproducibility. However, when the final sharpening finishing process is performed only by thermal faceting, residual oxygen atoms act on the iridium tip as impurities, and stable ion emission may be inhibited. That is, even if iridium is thermally processed, a desired crystal plane does not grow, and therefore, it is difficult to perform control so as to form a pyramid structure which is surrounded by given crystal planes and has an apex constituted by a single atom at a given position, and a method for sharpening the desired position without using oxygen has been demanded from the viewpoint of stable operation.

(With Respect to Iridium Tip)

Further, in the case where a conventional iridium tip terminated with a single atom is used in an electron source of an electron microscope or a gas field ion source of a focused ion beam apparatus, a problem arises that residual impurity atoms or molecules in the apparatus tend to be adhered to the pyramid structure at the apex of the iridium tip. Due to this, the stability of the current of an electron beam emitted from the electron source or an ion beam emitted from the ion source is lost so that a problem arises that desired processing is difficult to perform or a desired observation image cannot be obtained.

Further, in the conventional iridium tip terminated with a single atom, the atom at the most tip end tends to be detached in a short time, and therefore, even if the termination with a single atom can be reproduced by a process such as heating, the atom at the most tip end may be detached in a state where the tip is mounted on the electron source of the electron microscope or the gas field ion source of the focused ion beam apparatus. In this case, the observation or analysis operation by the electron microscope or the focused ion beam apparatus is interrupted, and a regeneration process for terminating the iridium tip with a single atom is needed, and also before and after this regeneration process, an adjustment operation such as beam adjustment is needed. Therefore, it has been found by an experiment made by the inventors of the present application that the conventional iridium tip is not preferred from the practical viewpoint.

As described above, in the tungsten tip, the sharpened apex of the tungsten tip tends to be constituted by three atoms, and therefore, the amount of a beam current reaching a sample to be irradiated may be decreased and the beam may vary. Further, due to a residual gas such as oxygen or nitrogen, the surface of the tip tends to be etched, and the tip end at the atomic level may be lost.

On the other hand, in the iridium tip, the apex can be terminated with a single atom, and also iridium has higher chemical resistance than tungsten, and therefore, damage to the apex by a residual gas is inhibited. However, impurities tend to be adhered to the pyramid structure of the conventional iridium tip due to the crystal plane constituting the pyramid structure, and it is difficult to keep the tip to function properly over a long period of time.

The present invention has been made in view of the above circumstances, and an object of the present invention is to provide an iridium tip having a pyramid structure in the apex portion, wherein the production thereof can be performed with high reproducibility, impurities are hardly adhered thereto, the apex thereof is constituted by a single atom, and the pyramid structure is capable of maintaining this atom over a long period of time.

Further, another object is to provide an electron source or a gas field ion source capable of continuously emitting an electron beam or an ion beam for a long period of time in a state where the current stability is favorable, or a probe capable of making an observation with high reproducibility even if it is used for a long period of time by using such an iridium tip.

Further, another object is to provide an electron microscope, a focused ion beam apparatus, and a scanning probe microscope having a long lifetime and high stability by mounting such an electron source or a gas field ion source or a scanning probe tip (probe) thereon.

Further, another object is to provide an electron beam applied analysis apparatus such as an electron beam microanalyzer or an Auger electron spectrometer having high resolution by mounting such an electron source thereon.

Further, another object is to provide an ion-electron multi-beam apparatus having a long lifetime and high stability by mounting such an electron source and a gas field ion source thereon.

Further, another object is to provide a scanning probe microscope which can be used properly for a long period of time by mounting such a scanning probe tip (probe) thereon.

Further, another object is to provide a mask repair apparatus capable of performing highly accurate processing over a long period of time by using such an iridium tip.

(1) According to an aspect of the present invention, there is provided an iridium tip comprising a pyramid structure having one {100} crystal plane as one of a plurality of pyramid surfaces in a sharpened apex portion of a single crystal with <210> orientation.

(2) In the iridium tip according to (1), the pyramid structure may have one {111} crystal plane as one of the plurality of pyramid surfaces in the apex portion.

(3) In the iridium tip according to (1) or (2), the apex portion of the pyramid structure may have an apex with <210> orientation and surrounded by one {100} crystal plane and two {111} crystal planes.

(4) In the iridium tip according to any one of (1) to (3), the pyramid structure may have an apex constituted by a single iridium atom.

(5) In the iridium tip according to (4), the pyramid structure may include a first layer composed of the single iridium atom constituting the apex of the pyramid structure, a second layer immediately below the first layer and composed of three iridium atoms located at vertices of a triangle, and a third layer immediately below the second layer and composed of six iridium atoms located at vertices and sides of a triangle.

(6) According to an aspect of the present invention, there is provided a gas field ion source comprising: the iridium tip according to any one of (1) to (5) as an emitter which is configured to emit an ion beam; an ion source chamber which accommodates the emitter; a gas supply section which is configured to supply a gas to be ionized, to the ion source chamber; an extraction electrode which is configured to ionize the gas to generate ions of the gas and apply a voltage for extracting the ions of the gas from the emitter; and a temperature control section which is configured to cool the emitter.

(7) In the gas field ion source according to (6), a main component of the gas may be at least any one of hydrogen, nitrogen, oxygen, helium, neon, argon, krypton, and xenon, or a mixture of at least any of these gases.

(8) In the gas field ion source according to (6), a main component of the gas may be nitrogen.

(9) In the gas field ion source according to (8), a purity of nitrogen which is the main component of the gas may be 99% or more.

(10) According to an aspect of the present invention, there is provided a focused ion beam apparatus comprising: the gas field ion source according to any one of (6) to (9); and a control section which is configured to form a focused ion beam with the ions of the gas generated in the gas field ion source and irradiate a sample with the focused ion beam so as to perform at least one of observation, processing and analysis on an irradiated region of the sample.

(11) According to an aspect of the present invention, there is provided an electron source comprising: the iridium tip according to any one of (1) to (5) as a tip which is configured to emit electrons; and an extraction electrode which is configured to generate the electrons and apply a voltage for extracting the electrons from the iridium tip.

(12) According to an aspect of the present invention, there is provided an electron microscope comprising: the electron source according to (11); and a control section which is configured to form an electron beam with the electrons generated in the electron source and irradiate a sample with the electron beam so as to perform at least one of observation and measurement on a minute region of the sample. The electron microscope may be at least one of a scanning electron microscope, a transmission electron microscope and a scanning transmission electron microscope.

(13) According to an aspect of the present invention, there is provided an electron beam applied analysis apparatus comprising: the electron source according to (11); and a control section which is configured to form an electron beam with the electrons generated in the electron source and irradiate a sample with the electron beam so as to perform at least one of observation, measurement and analysis of the sample.

(14) The electron beam applied analysis apparatus according to (13) may be at least one of an electron beam microanalyzer and an Auger electron spectrometer.

(15) According to an aspect of the present invention, there is provided an ion-electron multi-beam apparatus comprising: the gas field ion source according to any one of (6) to (9); and a control section which is configured to irradiate substantially same position on a sample with a focused ion beam and an electron beam, wherein the focused ion beam is obtained from the gas field ion source.

(16) According to an aspect of the present invention, there is provided an ion-electron multi-beam apparatus comprising: the electron source according to (11); and a control section which is configured to irradiate substantially same position on a sample with a focused ion beam and an electron beam, wherein the electron beam is obtained from the electron source.

(17) According to an aspect of the present invention, there is provided a scanning probe microscope comprising: the iridium tip according to any one of (1) to (5) as a probe; and a control section which is configured to measure a shape and a state at an atomic level of a surface of a sample by scanning the probe in a state where the probe is brought close to the surface of the sample.

(18) In the scanning probe microscope according to (17), the scanning probe microscope may be at least one of a scanning tunneling microscope and a scanning atomic force microscope.

(19) According to an aspect of the present invention, there is provided a mask repair apparatus comprising: the gas field ion source according to any one of (6) to (9); and a control section which is configured to form a focused ion beam with the ions of the gas generated in the gas field ion source so as to repair a defective part of a photomask by the focused ion beam.

(20) In the mask repair apparatus according to (19), the focused ion beam may be a nitrogen ion beam.

According to the above-described configuration, an iridium tip including a pyramid structure having an apex constituted by a single atom can be provided. The pyramid structure in the apex portion of the iridium tip can be produced with high positional reproducibility, impurities are hardly adhered thereto, and the atom at the apex is maintained over a long period of time.

Further, according to the above-described configuration, the current stability of an electron beam or an ion beam is favorable, and an electron source or a gas field ion source capable of continuously emitting each beam for a long period of time, and also a probe capable of making an observation with high reproducibility even if it is used for a long period of time can be provided.

Further, by using the electron source or the gas field ion source, and the probe according to the above-described configuration, an electron microscope, an electron beam applied analysis apparatus, a focused ion beam apparatus, and a scanning probe microscope having a long lifetime and high stability can be provided.

BRIEF DESCRIPTION OF THE DRAWINGS

The above and other aspects of the present invention will become more apparent and more readily appreciated from the following description of illustrative embodiments of the present invention taken in conjunction with the attached drawings, in which:

FIGS. 5A and 5B are views for explaining a pyramid structure at an apex portion of the iridium tip according to an illustrative embodiment of the invention, wherein FIG. 5A is a view of an atomic model of the pyramid structure, and FIG. 5B is an explanatory view for showing crystal planes;

FIGS. 6A and 6B are views showing the arrangement of atoms in a crystal plane in the pyramid structure at the apex portion of the iridium tip according to an illustrative embodiment of the invention, wherein FIG. 6A is a front view of a {100} crystal plane constituting a pyramid surface, and FIG. 6B is a front view of a {111} crystal plane constituting a pyramid surface;

FIGS. 7A and 7B are views for explaining a first pyramid structure at an apex portion of an iridium tip of a conventional example, wherein FIG. 7A is a view of an atomic model of the pyramid structure, and FIG. 7B is an explanatory view for showing crystal planes;

FIGS. 8A and 8B are views for explaining a second pyramid structure at an apex portion of an iridium tip of a conventional example, wherein FIG. 8A is a view of an atomic model of the pyramid structure, and FIG. 8B is an explanatory view for showing crystal planes;

FIGS. 9A and 9B are views showing the arrangement of atoms in a crystal plane in the pyramid structure at the apex portion of the iridium tip of the conventional example, wherein FIG. 9A is a front view of a {110} crystal plane constituting a pyramid surface, and FIG. 9B is a front view of a {311} crystal plane constituting a pyramid surface;

FIGS. 15A to 15C are schematic views for explaining a conventional tip, wherein FIG. 15B is an enlarged view of an apex portion A in FIG. 15A, and FIG. 15C is an enlarged view of an apex portion B in FIG. 15B; and FIG. 16 provides a table illustrating various atomic arrangements depending on a number of atoms according to an illustrative embodiment of the invention.

DETAILED DESCRIPTION

Hereinafter, an iridium tip, a gas field ion source, a focused ion beam apparatus, an electron source, an electron microscope, an electron beam applied analysis apparatus, an ion-electron multi-beam apparatus, a scanning probe microscope, and a mask repair apparatus according to illustrative embodiments of the invention will be described with reference to the accompanying drawings.

(First Illustrative Embodiment) Iridium Tip Production Apparatus

Figure 1:
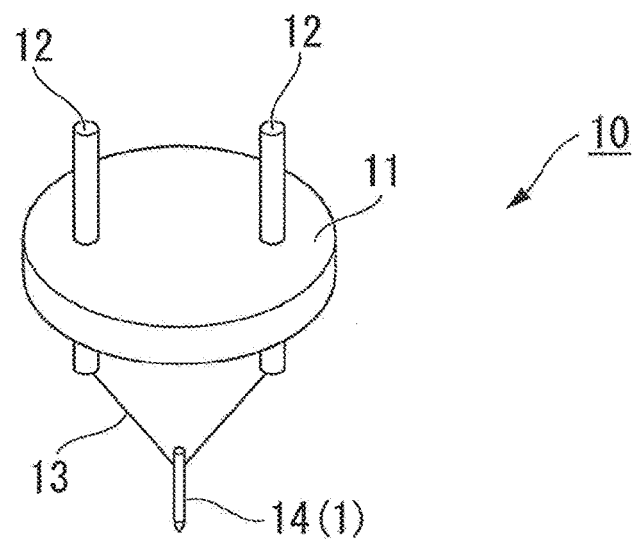
FIG. 1 is a perspective view of a tip assembly according to an illustrative embodiment of the invention.

First, with reference to FIG. 1, a tip assembly 10 to be used for sharpening of an iridium tip 1, evaluation of ion emission, formation of an ion beam, and the like will be described.

The tip assembly 10 includes a pair of conducting pins 12 fixed to an insulating base member 11, a filament 13 composed of a fine wire of tungsten or the like connected between the end portions of the pair of conducting pins 12, and a tip member 14 of a rod-shaped iridium single crystal electrically and mechanically fixed to the filament 13.

Next, with reference to FIG. 2, an iridium tip production apparatus 20 for further sharpening the iridium tip 1 having undergone electrolytic polishing (described later), and processing into the iridium tip 1 having an apex constituted by a single iridium atom will be described.

Figure 2:
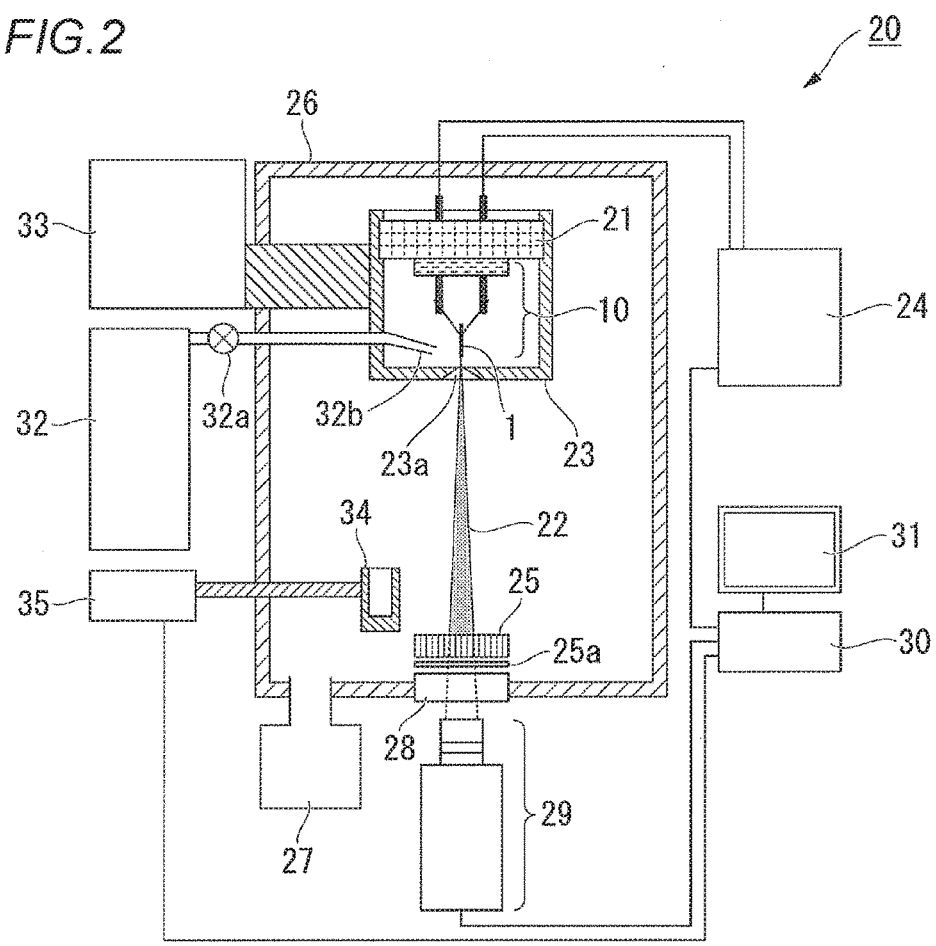
FIG. 2 is a schematic structural view of an iridium tip production apparatus for producing an iridium tip according to an illustrative embodiment of the invention.

FIG. 2 is a schematic structural view of the iridium tip production apparatus 20. The iridium tip production apparatus 20 includes an placement section 21 for placing the tip assembly 10, an extraction electrode 23 which generates a high electric field between the electrode and the iridium tip 1 to emit ions 22 from the apex (tip apex) of the iridium tip 1, a power source 24 which applies an accelerating voltage of the ions 22 to the iridium tip 1 and also heats the iridium tip 1, a detector (for example, Multi Channel Plate (MCP), or the like) 25 which detects the ions 22 emitted from the iridium tip 1, and a vacuum vessel 26 which accommodates these components therein.

Further, the iridium tip production apparatus 20 includes an exhaust device 27 which maintains the inside of the vacuum vessel 26 in a vacuum state, a camera (for example, a CCD camera or the like) 29 which takes (or observes) an FIM image generated by the detector 25 through a view port 28, a computing device 30 which records the FIM image taken by the camera 29 and also controls the power source 24, and a monitor 31 which displays the FIM image taken by the camera 29, and the like.

Further, the iridium tip production apparatus 20 includes a gas supply device 32 which supplies a gas to be ionized to the surroundings of the iridium tip 1, a cooling device 33 which cools the iridium tip 1 and, if necessary, the gas supplied from the gas supply device 32, a movable Faraday cup 34 which detects the current of the ions 22 emitted from the iridium tip 1, a moving mechanism 35 which moves the Faraday cup 34, and the like.

The base pressure in the vacuum vessel 26 is set to approximately $2 \times 10^{-8}$ Pa. The surface of the tip apex is preferably maintained in a clean state, and the base pressure is preferably lower. To the vacuum vessel 26, the gas supply device 32 is attached.

The gas supply device 32 can supply a gas, which is a raw material of the ions 22, into the vacuum vessel 26. This gas is an easily available high purity gas (for example, having a purity of 99.999% or more, etc.). This gas may be subjected to a gas purifier (not shown) so as to decrease the impurity concentration to about several ppb levels. It is necessary to decrease the impurity concentration for increasing the time for which the pyramid structure which is a nanostructure of the iridium tip 1 can be maintained, and it is preferred to decrease the base pressure in the vacuum vessel 26 and also to decrease the impurity concentration in the gas.

In this illustrative embodiment, a plurality of gas vessels (not shown) filled with each gas such as hydrogen, oxygen, nitrogen, helium, neon, argon, krypton, or xenon, are disposed in the gas supply device 32, and a desired gas can be supplied in an appropriate amount as needed. In the gas supply device 32, a valve 32a is adjusted so as to supply an appropriate amount of a given gas species to the apex of the iridium tip 1, and the gas is gradually supplied to the surroundings of the iridium tip 1 from a nozzle 32b in the vicinity of the iridium tip 1.

The iridium tip 1 is connected to the cooling device 33 such as a cryofreezer through a connection section 33a, and the cooling temperature is adjusted to about 60 K. According to this configuration, the FIM image generated by the detector 25 becomes brighter, and a sharp image can be taken by the camera 29. This cooling temperature may be changed according to the gas species to be supplied by the gas supply device 32.

The power source 24 is a high voltage current power source and is connected to the iridium tip 1 through a feedthrough (not shown) in the vacuum vessel 26, and can apply a high voltage to the iridium tip 1 through the filament 13. The power source 24 is configured to be connected so that, for example, the current power source has a potential output of a high voltage power source. The voltage to be output from the power source 24, a current to be applied to the filament 13 by the power source 24, and the like are controlled by the computing device 30 connected to the power source 24. The computing device 30 can automatically control the current and voltage output from the power source 24, and for example, can change the current at a constant rate. According to this configuration, the computing device 30 can repeat the remolding conditions with high reproducibility.

The extraction electrode 23 has, for example, ground potential, and a positive voltage is applied to the iridium tip 1. The ions 22 generated at the tip apex are extracted along the electric field generated by the iridium tip 1 and the extraction electrode 23, and pass through an orifice 23a provided in the extraction electrode 23 and are output as an ion beam. The ion beam has an energy corresponding to the voltage applied to the iridium tip 1 and is emitted from the extraction electrode 23 to the detector 25.

Incidentally, in this illustrative embodiment, the potential of the iridium tip 1 can be made variable by causing the extraction electrode 23 to have an arbitrary potential. That is, it is possible to configure the apparatus to have a triple structure including the vacuum vessel 26, the extraction electrode 23, and the iridium tip 1 in this order from the outside. In this case, the computing device 30 arbitrarily set the potential of the iridium tip 1, and set the potential of the extraction electrode 23 to a potential, which is negative with respect to the potential of the iridium tip 1, and at which a gas, which is a raw material of the ions 22, is ionized. According to this configuration, an accelerating energy of the ion beam can be appropriately set.

The detector 25 and a screen 25a are disposed along the extension of the line connecting the apex of the iridium tip 1 to the orifice 23a of the extraction electrode 23. To the detector 25, a predetermined voltage (for example, +1.5 kV or the like) is applied, and generated electrons are amplified. To the screen 25a, a predetermined voltage (for example, +3.0 kV or the like) is applied, and the electrons amplified by the detector 25 collide with the screen 25a, and a phosphor of the screen 25a emits light. This emitted light is projected on the screen 25a and an image thereof is taken by the camera 29 through the view port 28, and is set so that it can be observed as an FIM pattern (FIM image). The camera 29 is connected to the computing device 30, and the images taken periodically are stored in the computing device 30.

When the number of bright points in the FIM image becomes one, it can be determined that the apex of the iridium tip 1 is constituted by a single atom. Then, the Faraday cup 34 is moved so that the ion beam enters the Faraday cup 34, and a beam current signal is introduced into the computing device 30 by the Faraday cup 34. The beam current measurement enables the measurement of a current value at this time point and also enables the continuous measurement of a current variation over a long period of time.

In the vacuum vessel 26 of the iridium tip production apparatus 20, a high vacuum state is always maintained, and therefore, an appropriate mechanism may be provided such that the iridium tip 1 is temporarily kept in a preliminary exhaust chamber (not shown), and a process such as cleaning by heating at a high temperature for contaminations (impurities and the like) adhered to the iridium tip 1 is performed, and thereafter, the iridium tip 1 is introduced into the vacuum vessel 26.

(Second Illustrative Embodiment) Iridium Tip Production Method

Figure 3:
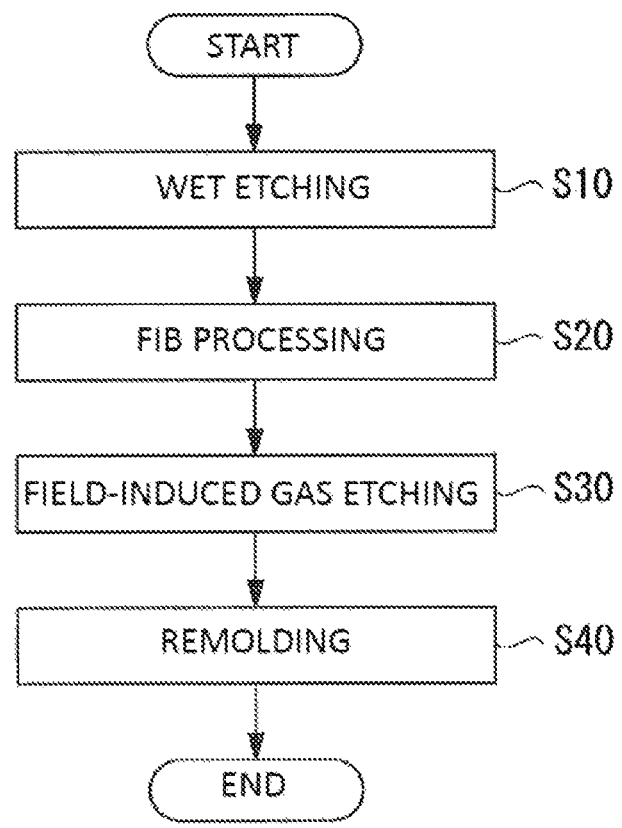
FIG. 3 is a flowchart showing an iridium tip production method according to an illustrative embodiment of the invention.

As shown in FIG. 3, an iridium tip production method includes a wet etching step S10, an FIB processing step S20, a field-induced gas etching step S30, and a remolding step S40, which are performed sequentially. Hereinafter, the respective steps will be described.

First, in the wet etching step S10, as a raw material of the iridium tip 1 to be sharpened, a tip member 14 is used, which is a rod-shaped iridium single crystal having a given shape (for example, a diameter of 0.3 mm, a length of 8 mm, etc.), and in which the longitudinal direction is aligned with <210> orientation, is used. Then, for example, by wet etching, the rod-shaped tip member 14 is sharpened until the diameter of the apex in a conical shape is decreased to a predetermined value (for example, from several hundreds of nanometers to several micrometers, or the like), whereby the iridium tip 1 is formed.

Specifically, the tip member 14 of iridium and a counter electrode of platinum are immersed in, for example, a solution of 1 mol/L potassium hydroxide, and an AC voltage is applied between these two electrodes (that is, between the tip member 14 and the counter electrode) to achieve electrolytic polishing. The AC voltage to be applied is set to, for example, approximately 30 V (rms) at a frequency of 60 Hz. By this wet etching step, the apex of the tip member 14 is formed into a conical shape having an apex diameter of several hundreds of nanometers to several micrometers. After completing the wet etching, impurities such as the electrolytic solution are removed from the iridium tip 1 by washing the iridium tip 1 with water and acetone, or the like.

Subsequently, in the FIB processing step S20, in the case where the diameter of the apex of the iridium tip 1 is further decreased to about several tens of nanometers to several hundreds of nanometers, after performing the wet etching step S10, the iridium tip 1 is introduced into a known gallium focused ion beam (Ga-FIB) apparatus (not shown), and FIB processing is performed, whereby the diameter of the apex is decreased to about several tens of nanometers to several hundreds of nanometers.

Subsequently, in the field-induced gas etching step S30, the iridium tip 1 is placed in a gas field ion source 70 (described later), or the iridium tip production apparatus 20, and the surroundings of the iridium tip 1 are brought to a vacuum state. The production in the apparatus of FIG. 2 will be described as an example. The pressure in the vacuum vessel 26 is adjusted to a base pressure (for example, $2 \times 10^{-8}$ Pa, or the like), and the cooling temperature of the iridium tip 1 is adjusted to a predetermined temperature (for example, about 60 K). Then, helium is supplied from the gas supply device 32 into the vacuum vessel 26 until the pressure becomes, for example, $1 \times 10^{-4}$ Pa or the like. The computing device 30 controls the power source 24 so as to apply a voltage to the iridium tip 1. When the voltage applied to the iridium tip 1 (tip voltage) reaches, for example, about 4 kV, the FIM pattern (FIM image) of helium is imaged by the camera 29.

In the iridium tip 1 having undergone the FIB processing step S20 or the iridium tip 1 with a damaged apex structure, impurities are adsorbed on the surface of the apex of the iridium tip 1, and therefore, a pattern with no crystallinity is obtained. When the tip voltage is gradually increased and the field strength at the tip apex is increased higher than the evaporation field strength of iridium, the iridium atom begins to be field-evaporated. When the several atomic layers on the surface of the apex of the iridium tip 1 are field-evaporated, clean crystalline iridium surface is exposed. The tip voltage at this time is increased to about 5 kV to about 6 kV, for example. Then, when the tip voltage is decreased by, for example, about 1 kV, the tip voltage reaches an optimum voltage (best imaging voltage) at which an image is obtained by helium, and thus, an FIM pattern in which the atoms are regularly arranged appears. When the surface becomes a clean surface, a defect may be observed in the iridium crystal. In the case where there is no defect, the process proceeds to the field-induced gas etching step S30, or the step S30 is skipped over and the process proceeds to the remolding step S40. In the case where there is a crystal defect, a desired pyramid structure cannot be formed in the remolding step S40. In such a case, by combining field-induced gas etching with field evaporation, the apex of the crystal is ground to a region where there is no crystal defect. Based on if a clean surface is observed, it is determined whether the process proceeds to the remolding step S40.

Subsequently, the extraction voltage is set to a value lower than the highest voltage applied in the field evaporation by about 0.5 kV (for example, about 4.5 kV to 5.5 kV), and as a gas for etching, nitrogen or oxygen is supplied to the surroundings of the iridium tip 1 from the gas supply device 32 so that the pressure in the vacuum vessel is from about $1 \times 10^{-4}$ Pa to $1 \times 10^{-3}$ Pa.

In this case, the extraction voltage and the region to be etched of the iridium tip 1 have a predetermined correspondence relation. That is, when the extraction voltage is low, an apex region of the iridium tip 1 where the electric field is strong is etched, and when the extraction voltage is high, a peripheral region (for example, a base region or the like) of the iridium tip 1 except for the apex region is etched. Therefore, in this step, the extraction voltage is set high to such an extent that helium is field-ionized, so that the apex region of the iridium tip 1 is left, and the peripheral region thereof is etched. Accordingly, the number of iridium atoms which move in the remolding step S40 (described later) can be decreased, and the time required for performing the remolding step can be reduced. Further, the apex of the iridium tip 1 has a narrow and sharp shape, and therefore, the growth of the pyramid structure at an undesired position in the remolding step can be prevented. Here, when the field-induced gas etching proceeds, the apex is narrowed and sharpened, and therefore, the extraction voltage is decreased so that the atom at the apex is not field-evaporated.

When the apex is narrowed and sharpened to a desired range, while the extraction voltage is kept applied, the supply of the gas for etching by the gas supply device 32 is stopped, and the residual gas for etching is exhausted under vacuum. The best imaging voltage for helium at this time is approximately 3.6 kV. Thereafter, the extraction voltage is decreased so as to obtain a field strength at which nitrogen is field-ionized. By sufficiently performing vacuum exhaustion, the etching of the apex region of the iridium tip 1 can be prevented, or by rapidly decreasing the extraction voltage, the etching of the apex region of the iridium tip 1 can be further prevented.

Further, in the case where a crystal defect exists in the vicinity of the apex of the iridium tip 1, the extraction voltage is controlled so that the apex region of the iridium tip 1 is etched until the crystal defect is removed. Accordingly, even if a crystal defect exists in the vicinity of the apex of the iridium tip 1, the crystal defect is removed by etching.

Subsequently, in the remolding step S40, by using the iridium tip production apparatus 20, a pyramid structure which is a nanostructure is formed at the apex of the iridium tip 1.

The extraction voltage is decreased to, for example, about ⅓ of the optimum voltage for helium, that is, about 1.2 kV. This voltage substantially matches with the nitrogen imaging voltage. Then, nitrogen gas is introduced into the vacuum vessel 26, and the pressure is adjusted to, for example, $1 \times 10^{-3}$ Pa or the like. The extraction voltage is finely adjusted so that an FIM pattern of nitrogen can be observed. Then, the remolding step of this illustrative embodiment is started. Unlike the conventional remolding, the remolding is performed in a nitrogen atmosphere. Further, in the conventional remolding, heating is performed while maintaining the current of the filament 13 constant, and the tip voltage is increased, and thereafter, the tip apex is sharpened while decreasing the current of the filament 13. In contrast, in this illustrative embodiment, sharpening is performed according to the following procedure.

First, the iridium tip 1 is heated by applying a current of, for example, 3.5 A for 3 minutes to the filament 13 in a state where the extraction voltage is applied thereto. After completion of this heating, an FIM pattern of nitrogen is imaged and observed by the camera 29.

Then, in the case where the FIM pattern of nitrogen imaged and observed is almost not changed, heating is performed by increasing the current in increments of, for example, 0.1 A.

Figure 4:
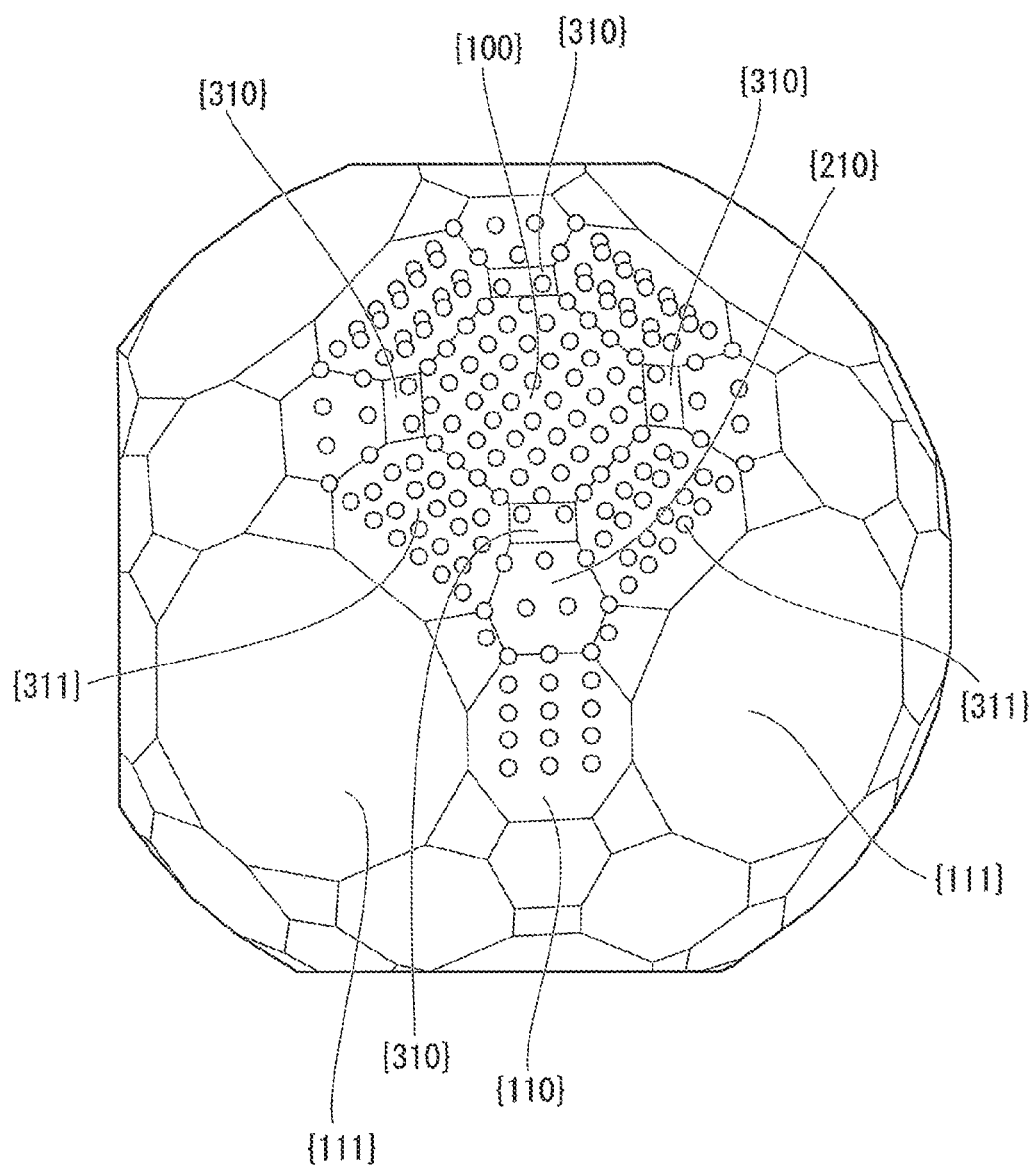
FIG. 4 is a view showing the arrangement of each crystal plane of iridium according to an illustrative embodiment of the invention.

Then, the current of the filament 13 is increased to, for example, approximately 3.9 A, a change is observed in the FIM pattern. That is, among the respective crystal planes shown in FIG. 4, the {111} crystal plane is expanded, and the {110} crystal plane is shrunk. Further, the {100} crystal plane is expanded, and the {311} crystal plane is shrunk. When the facet planes are largely changed in this manner, the apex of the iridium tip 1 is sharpened, and therefore, the tip voltage at which the FIM pattern of nitrogen is imaged and observed (that is, the tip voltage at which the FIM pattern of nitrogen is seen) by the camera 29 is decreased by, for example, several hundreds of volts. Incidentally, the tip voltage at which the FIM pattern of nitrogen is seen is approximately 0.9 kV or so.

Then, when the voltage at which the FIM pattern of nitrogen is seen is decreased, the current of the filament 13 is fixed at, for example, 3.9 A, and the tip voltage for heating is set to, for example, a value of 20% to 180% of the extraction voltage at which the FIM pattern of nitrogen is seen at this time point. In many cases, the tip voltage is changed to a value on the decreasing side. Incidentally, the tip voltage of heating is not limited to changing to a value on the decreasing side, which is equal to or lower than the tip voltage at which the FIM pattern of nitrogen is seen at this time point, and for example, according to the changing state of the crystal at the apex of the iridium tip 1 obtained based on the FIM pattern of nitrogen or the like, the tip voltage may be changed to a value on the increasing side, which is equal to or higher than the extraction voltage at which the FIM pattern of nitrogen is seen at this time point.

Then, when heating is repeated by, for example, setting the tip voltage to 0.5 kV and the current of the filament 13 to 3.9 A, a bright point pattern including several bright points is imaged and observed by the camera 29.

Then, finally, only one bright point is left, and the apex of the iridium tip 1 becomes a state where the apex of the iridium tip 1 is constituted by only a single atom.

As an example of changing the extraction voltage to a value on the increasing side, which is higher than the value at which the FIM pattern of nitrogen is seen, there is a case where, when remolding is performed at an 80% of the extraction voltage, two {111} crystal planes do not grow with a ridge line formed by being interposed between the two {111} crystal planes remaining double, and in that case, when the extraction voltage is increased to 120% by gradually increasing the extraction voltage, the {111} crystal planes grow so that one ridge line can be formed.

Incidentally, in the remolding step S40, the iridium tip 1 can also be produced by using oxygen gas in place of nitrogen gas. That is, oxygen gas is supplied in place of nitrogen gas into the vacuum vessel 26 from the gas supply device 32, the tip voltage is set so that the FIM pattern of nitrogen is seen, and the iridium tip 1 is heated.

Then, the supply of oxygen gas is stopped, and nitrogen gas is supplied, and the tip voltage at which the FIM pattern of nitrogen is seen is confirmed. The supply of nitrogen gas is stopped at this voltage, and oxygen gas is supplied, and the iridium tip 1 is heated. These processes are repeated. However, at this time, the heating temperature is gradually increased.

Then, when it is detected that the atom at the apex of the iridium tip 1 begins to move based on, for example, the FIM pattern of nitrogen or the like, the extraction voltage is set to, for example, a value of 20% to 180% of the extraction voltage at which the FIM pattern of nitrogen is seen at this time point, and oxygen gas is supplied, and the iridium tip 1 is heated. In many cases, the extraction voltage is changed to a value on the decreasing side. Incidentally, the tip voltage for heating is not limited to changing to a value on the decreasing side, which is equal to or lower than the tip voltage at which the FIM pattern of nitrogen is seen at this time point, and for example, according to the changing state of the crystal at the apex of the iridium tip 1 obtained based on the FIM pattern of nitrogen or the like, the tip voltage may be changed to a value on the increasing side, which is equal to or higher than the tip voltage at which the FIM pattern of nitrogen is seen at this time point.

Then, finally, only one bright point is left, and the apex of the iridium tip 1 becomes a state where the apex of the iridium tip 1 is constituted by only a single atom.

Further, in place of nitrogen, helium or hydrogen may also be used. For example, in the case where nitrogen gas is used as an ion source gas, remolding is performed using nitrogen gas, and in the case where hydrogen gas is used as an ion source gas, remolding is performed using hydrogen gas, whereby an ion beam can be irradiated without changing the introduction gas.

Figure 5A:
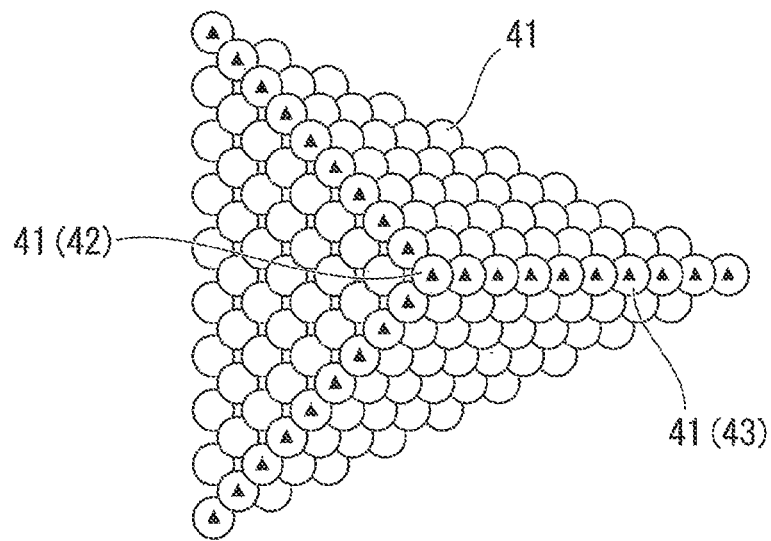
Figure 5B:
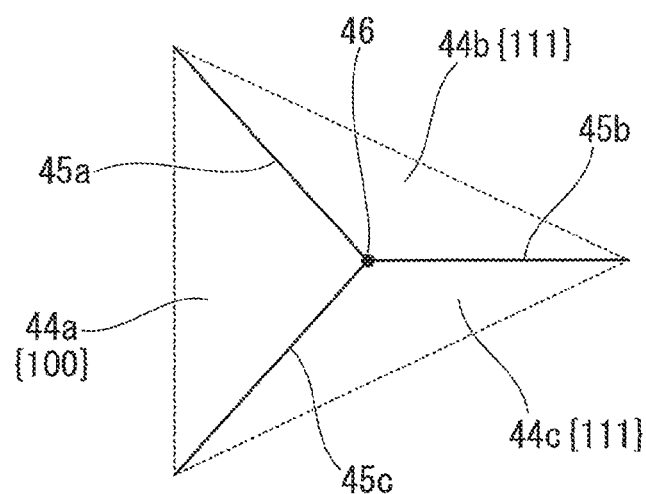

According to the processing of the above-described step S10 to step S40, the iridium tip 1 including a pyramid structure which has an apex with <210> orientation and constituted by only a single atom surrounded by one {100} crystal plane and two {111} crystal planes as shown in FIGS. 5A and 5B can be produced.

In the case where the iridium tip 1 is used in the gas field ion source 70 (described later), the field-induced gas etching step S30 and the remolding step S40 can be performed within the gas field ion source 70, from which an ion beam is emitted. Accordingly, a step of relocating the iridium tip 1 from the outside of the gas field ion source 70 is not needed, and therefore, the adhesion of impurities during relocation can be prevented, and thus, the work efficiency can be improved.

(Third Illustrative Embodiment) Iridium Tip

An iridium crystal has a face-centered cubic structure, and iridium atoms are located at each of the eight corners and at the center of each of the six faces of a cube.

FIGS. 5A and 5B are views created based on the results of observation of the FIM image of the apex portion of the iridium tip 1 according to this illustrative embodiment, and are model views showing a pyramid structure when viewing the apex portion of the iridium tip 1 according to this illustrative embodiment from the <210> orientation. FIG. 5A shows an atomic arrangement with one circle made to correspond to one iridium atom 41. FIG. 5B is a view schematically showing crystal planes.

The pyramid structure at the apex portion of the iridium tip 1 has a triangular pyramid shape having three side surfaces (pyramid surfaces) and an apex constituted by only a single iridium atom 41(42). The constituent atoms of this pyramid structure are all iridium atoms. As shown in FIG. 5A, the iridium atoms 41 present in the uppermost layer (outermost surface) of each crystal plane are indicated by white circles, and the indication of the internal iridium atoms 41 present below the uppermost layer is omitted. Further, to each of the iridium atoms 41(43) located on the ridge lines of the triangular pyramid shape, a black triangle mark is attached. As shown in FIG. 5B, the pyramid structure has ridge lines 45a, 45b, and 45c formed by each of the three pyramid surfaces 44a, 44b, and 44c, and an apex 46 constituted by a single iridium atom 41(42).

The pyramid surface 44a in FIG. 5B is a {100} crystal plane, and the pyramid surfaces 44b and 44c in FIG. 5B are {111} crystal plane.

Figure 6A:
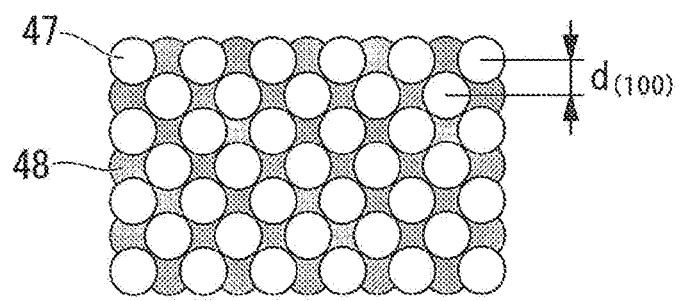
Figure 6B:
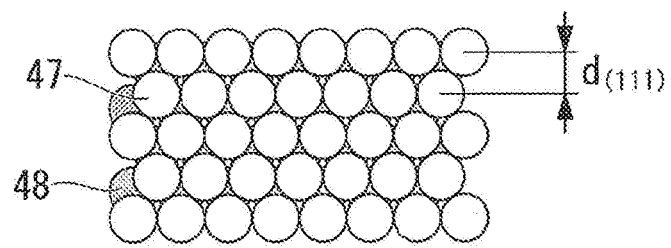

FIGS. 6A and 6B are views schematically showing the atomic arrangement when viewing each of the three pyramid surfaces 44a, 44b, and 44c of the pyramid structure according to this illustrative embodiment from the front (that is, from the normal direction). In FIGS. 6A and 6B, the iridium atoms 47 in the uppermost layer (surface layer) are indicated by white circles, and the iridium atoms 48 in the second layer immediately below the uppermost layer are indicated by gray circles, and the indication of the other iridium atoms is omitted.

A single iridium atom 42 constituting the apex of this pyramid structure is defined as the first layer, and in the atomic arrangement of the second layer immediately below the first layer, as shown in Table 1 of FIG. 16, three iridium atoms 41 are located at each vertex of an isosceles triangle close to an equilateral triangle (for example, an isosceles triangle in which when assuming that the length of one side is taken as 1, the length of the isosceles side is approximately 1.22). In the atomic arrangement of the third layer immediately below the second layer, six iridium atoms 41 are located at each vertex and each side of a triangle.

Incidentally, the atomic arrangements of the second layer and the third layer are detected by forcibly detaching the iridium atom 41(42) at the apex by a strong electric field in the observation of the FIM image, and it has been found by the inventors of the present application that they match with the model views shown in FIGS. 5A and 5B.

When the iridium tip 1 in a state where the iridium atom 41(42) at the apex has been detached is used as a needle-shaped electrode of an electron source or an ion source, or as a probe of a scanning probe microscope, the amount of a beam current reaching a sample is decreased or the positional resolution of the scanning probe microscope is deteriorated, and therefore, such a tip is not preferred. In this case, by performing a regeneration process for the tip apex (described later), the atom at the apex is maintained as a single atom.

Figure 7A:
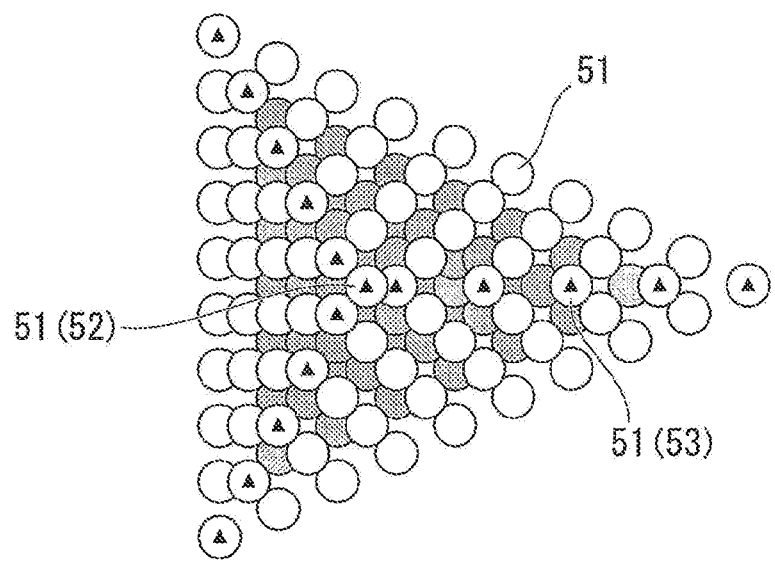
Figure 7B:
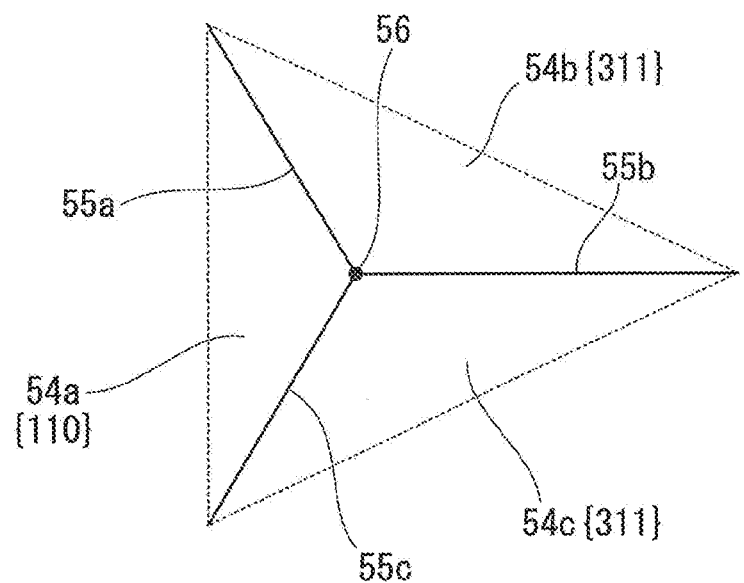
Figure 8A:
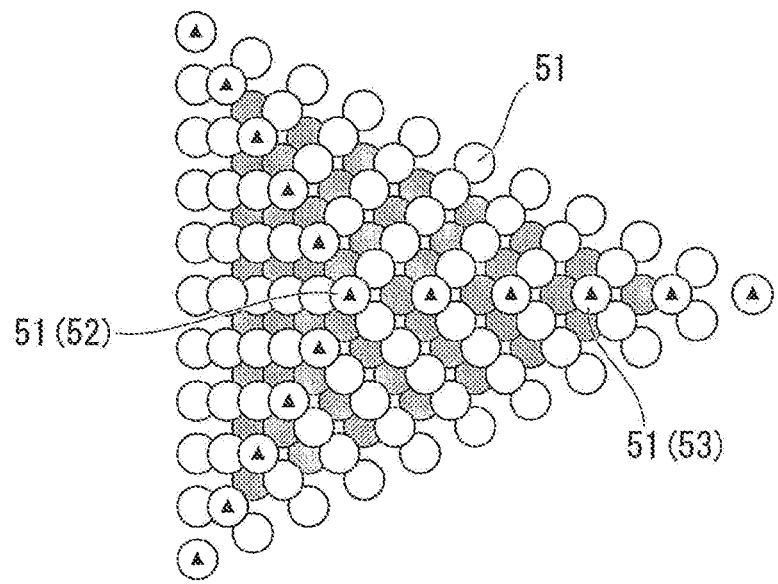
Figure 8B:
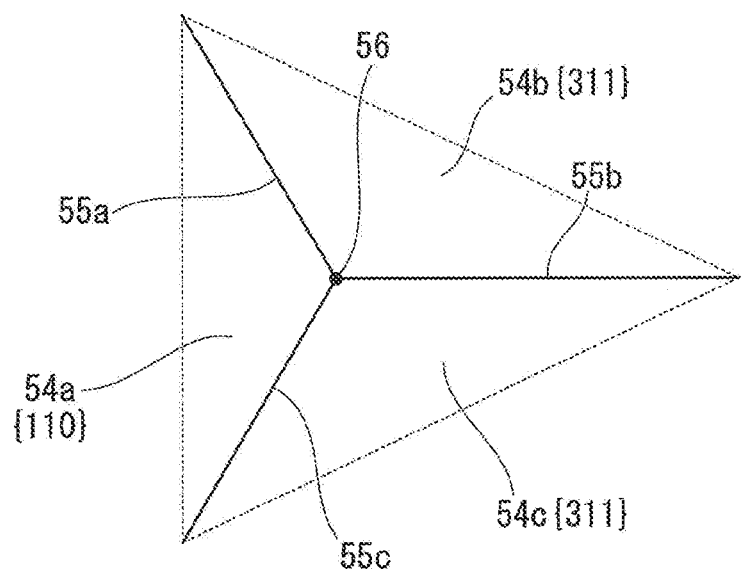

On the other hand, as Comparative Examples, the apex structures of iridium tips of conventional examples are shown in FIGS. 7A, 7B, 8A and 8B. FIGS. 7A and 7B are created with reference to the above-described document, Ivan Ermanoski et al., Surf. Sci. vol. 596, (2005), pp. 89-97, "Atomic structure of O/Ir (210) nanofacets", and FIGS. 8A and 8B are created with reference to the above-described document, Hong-Shi Kuo et al., Nanotechnology, vol. 20, (2009) No. 335701, "A Single-atom sharp iridium tip as an emitter of gas field ion sources". FIGS. 7A and 8A are model views showing the pyramid structures when viewing the iridium tips of the conventional examples from the <210> orientation. FIGS. 7B and 8B are views schematically showing the crystal planes.

As shown in FIGS. 7A and 8A, the iridium atoms 51 present in the uppermost layer (outermost surface) of each crystal plane are indicated by white circles, and the internal iridium atoms 51 present below the uppermost layer are indicated by gray circles. At the apex of the triangular pyramid shape, one iridium atom 51(52) is located, and to each of the iridium atoms 51(53) located on the ridge lines of the triangular pyramid shape, a black triangle mark is attached. As shown in FIGS. 7B and 8B, the pyramid structure has ridge lines 55a, 55b, and 55c formed by each of the three pyramid surfaces 54a, 54b, and 54c, and an apex 56 constituted by a single iridium atom 51(52).

The pyramid surface 54a in FIGS. 7B and 8B is a {110} crystal plane, and the pyramid surfaces 54b and 54c in FIGS. 7B and 8B are {311} crystal plane.

A difference between the atomic arrangement shown in FIG. 7A and the atomic arrangement shown in FIG. 8A is that the number of the iridium atoms 51 constituting the base side of the pyramid surface 54a is an odd number or an even number, and in the atomic arrangement shown in FIG. 7A, the number is an even number, and in the atomic arrangement shown in FIG. 8A, the number is an odd number. Depending on whether the number of the iridium atoms 51 constituting this base side is an odd number or an even number, the arrangement of the iridium atoms 51 constituting the second layer and the third layer immediately below the iridium atom 51(52) in the uppermost layer (surface layer) at the apex varies. The second layer in the atomic arrangement shown in FIG. 7A includes three iridium atoms 51, and the second layer in the atomic arrangement shown in FIG. 8A includes six iridium atoms 51. The iridium atom 51(52) in the uppermost layer (surface layer) at the apex in the atomic arrangement shown in FIG. 8A is located at the intersecting point of the three ridge lines 55a, 55b, and 55c. On the other hand, the iridium atom 51(52) in the uppermost layer (surface layer) at the apex in the atomic arrangement shown in FIG. 7A is disposed at a slightly protruding position deviated from the intersecting point of the three ridge lines 55a, 55b, and 55c.

In the pyramid structures of the iridium tips of the conventional examples shown in FIGS. 7A and 8A, the interval between each of the iridium atoms 51(53) located on each of the ridge lines 55a, 55b, and 55c is wider than in the pyramid structure of the iridium tip 1 of this illustrative embodiment shown in FIG. 5A. Therefore, the inclination of each of the ridge lines 55a, 55b, and 55c, in other words, the inclination of each of the pyramid surfaces 54a, 54b, and 54c is smaller than the inclination of each of the ridge lines 45a, 45b, and 45c and each of the pyramid surfaces 44a, 44b, and 44c of the pyramid structure of the iridium tip 1 of this illustrative embodiment. That is, the apex portion of the iridium tip 1 of this illustrative embodiment is sharper than the apex portions of the iridium tips of the conventional examples, and has a structure in which the electric field is concentrated on the apex of the iridium tip 1. Accordingly, the iridium tip 1 of this illustrative embodiment can achieve ion emission at a lower extraction voltage than the iridium tips of the conventional examples, and therefore, the burden on a power source (for example, the power source 24 shown in FIG. 2, or the like) which applies an extraction voltage can be reduced, and also the occurrence of abnormal discharge between the apex of the iridium tip 1 and an extraction electrode (for example, the extraction electrode 23 shown in FIG. 2, or the like) can be prevented.

Figure 9A:
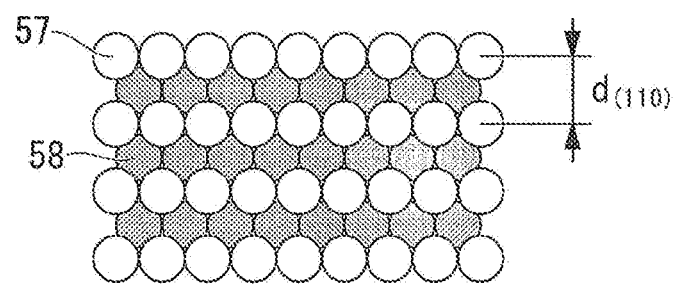
Figure 9B:
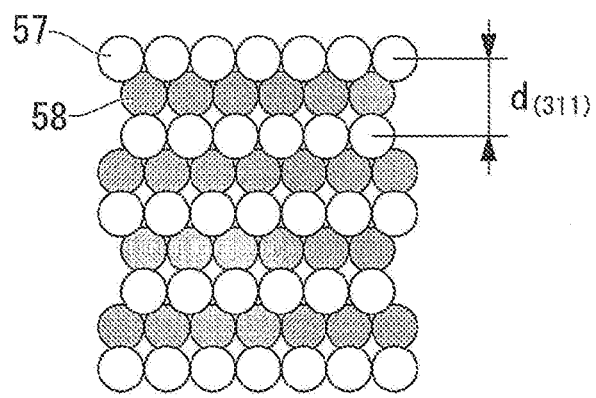

FIGS. 9A and 9B are views schematically showing the atomic arrangement when viewing each of the three pyramid surfaces 54a, 54b, and 54c of the pyramid structure of the iridium tip of the conventional example from the front (that is, from the normal direction). In FIGS. 9A and 9B, the iridium atoms 57 in the uppermost layer (surface layer) are indicated by white circles, and the iridium atoms 58 in the second layer immediately below the uppermost layer are indicated by gray circles, and the indication of the other iridium atoms is omitted.

As shown in Table 1 of FIG. 16, the number of iridium atoms in the first layer, the second layer, and the third layer of the pyramid structure of the iridium tip 1 of this illustrative embodiment is one, three, and six, respectively, however, the number of iridium atoms in the first layer, the second layer, and the third layer of the pyramid structure of the iridium tip of the conventional example shown in FIG. 7A is one, three, and ten, respectively, and the number of iridium atoms in the first layer, the second layer, and the third layer of the pyramid structure of the iridium tip of the conventional example shown in FIG. 8A is one, six, and fifteen, respectively. That is, it is apparent that the pyramid structure of the iridium tip 1 of this illustrative embodiment and the pyramid structure of the iridium tip of the conventional example differ in the atomic arrangement to the third layer.

Further, the pyramid structure of the iridium tip 1 of this illustrative embodiment and the pyramid structure of the iridium tip of the conventional example differ in the indices of crystal planes constituting the pyramid surfaces. That is, the {100} crystal plane and the {111} crystal plane constituting the pyramid surfaces of the pyramid structure of the iridium tip 1 of this illustrative embodiment are low index planes having a higher atomic density than the {110} crystal plane and the {311} crystal plane constituting the pyramid surfaces of the pyramid structure of the iridium tip of the conventional example. For example, it is visually confirmed that in the atomic arrangement in the outermost surface layer of the pyramid structure of the iridium tip 1 of this illustrative embodiment shown in FIGS. 6A and 6B, the iridium atoms are more densely arranged as compared with the atomic arrangement in the outermost surface layer of the pyramid structure of the iridium tip of the conventional example shown in FIGS. 9A and 9B.

For example, in a quantitative comparison, according to the lattice constant d, the distance $d_{(100)}$ between adjacent atomic rows in the {100} crystal plane of the iridium tip 1 of this illustrative embodiment shown in FIGS. 6A and 6B is 0.50d, and the distance $d_{(111)}$ between adjacent atomic rows in the {111} crystal plane thereof is 0.61d. On the other hand, with respect to each of the {311} crystal plane and the {110} crystal plane of the iridium tip of the conventional example shown in FIGS. 9A and 9B, the distance $d_{(311)}$ is 1.17d, and the distance $d_{(110)}$ is 1.00d. That is, as compared with the distance between the atomic rows in the pyramid surface of the pyramid structure of the iridium tip 1 of this illustrative embodiment, the distance between the atomic rows in the pyramid surface of the pyramid structure of the iridium tip of the conventional example is wider.

Further, according to the planar atomic density n in the uppermost layer in each crystal plane, in consideration that the lattice constant of iridium is 0.3839 nm, the density n in the {100} crystal plane is $13.6 \times 10^{18}/m^2$ and the density n in the {111} crystal plane is $15.7 \times 10^{18}/m^2$, however, the density n in the {110} crystal plane is $9.6 \times 10^{18}/m^2$ and the density n in the {311} crystal plane is $8.2 \times 10^{18}/m^2$. That is, as compared with the atomic density in the outermost surface of the pyramid structure of the iridium tip 1 of this illustrative embodiment, the atomic density in the outermost surface of the pyramid structure of the iridium tip of the conventional example is further decreased, and a space between each of the atoms present on the surface is wider in the conventional example than in this illustrative embodiment.

As described above, since the distance between the atomic rows in the outermost surface layer in the pyramid structure of the iridium tip of the conventional example is wide and the planar atomic density is low, it is presumed that the probability that a different type of atom or molecule drifting around the tip is fit in the space between each of the iridium atoms is high. The fitting of this different type of atom in the space may deteriorate the atomic arrangement of the iridium crystal at the apex of the iridium tip and disturb the electric field distribution at the apex of the iridium tip. As a result, the ion current emitted from the apex of the iridium tip may be unstable, and thus, the current of an ion beam irradiated on the surface of the sample may vary to cause disturbance of an observation image or disturbance of a processed surface. Further, such a different type of atom fit in the space between the iridium atoms cannot be easily removed, and therefore, when image disturbance or ion beam current variation occurs, a process requiring a complicated operation and a long time is needed, for example, a process in which the pyramid structure of the iridium tip is removed once by a high electric field, and the pyramid structure is produced again to stabilize ion emission is needed, and so on, and thus, a problem arises that a continuous observation or processing is difficult to perform.

On the other hand, in the one {110} crystal plane and the two {111} crystal planes constituting the pyramid surfaces of the pyramid structure of the iridium tip 1 of this illustrative embodiment, the atomic distance is smaller than in the conventional example, and therefore, fitting of a different type of atom in a space between the iridium atoms is prevented, and the tip is merely brought to such a state that a different type of atom is adhered (physically adsorbed or the like) onto the crystal planes. In this case, a substance adhered onto the crystal planes can be easily detached by slight heating or by adjustment to a weaker electric field than a field strength necessary for ionization of nitrogen gas to be applied to the iridium tip 1, and therefore, the triangular pyramid structure of the crystal constituted by only iridium atoms can be always maintained. As a result, the ion emission current is stable for a long period of time, and a variation in current of an ion beam irradiated on a sample can be prevented, and thus, a less disturbed observation image or a less disturbed processed surface can be obtained.

Further, the pyramid structure of the iridium tip 1 of this illustrative embodiment is configured such that the atomic distance is small, and therefore, it is approved that the iridium tip 1 is strong against external disturbance such as temperature.

As described above, the iridium tip 1 of this illustrative embodiment is sharper than the iridium tip of the conventional example, and therefore, can achieve ion emission at a lower voltage, and also is strong against external disturbance, and has a structure such that impurities are hardly adhered thereto, and thus can achieve stable electron emission, ion emission, or the like for a long period of time.

Incidentally, the iridium tip 1 of this illustrative embodiment has a structure in which the apex of the tip member 14 of an iridium single crystal is sharpened to the atomic level, however, it is not limited thereto, and the surface of the sharpened iridium tip 1 may be coated with an iridium thin film by plating or the like.

(Fourth Illustrative Embodiment) Gas Field Ion Source

There will be described a gas field ion source (GFIS) according to a fourth illustrative embodiment which employs the iridium tip 1 of the third illustrative embodiment.

Figure 10:
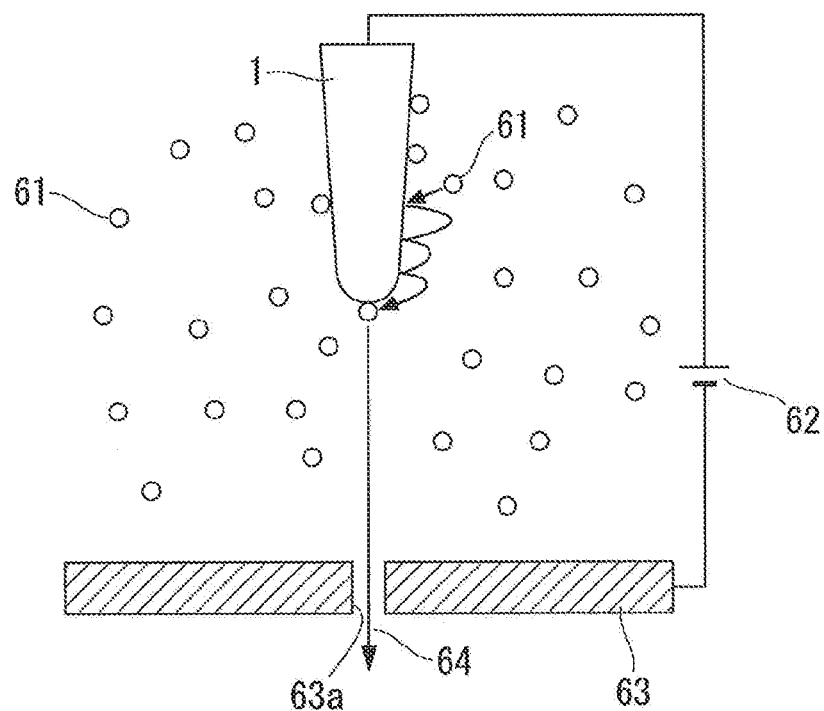
FIG. 10 is a schematic structural view for explaining ionization in a gas field ion source according to an illustrative embodiment of the invention.

First, the principle of ion generation will be described with reference to FIG. 10. As an ion source, a gas to be ionized is supplied, and in the surroundings of the iridium tip 1, a gas molecule or atom (hereinafter referred to as "gas molecule") 61 to be ionized exists. The iridium tip 1 is cooled by a cooling device (not shown).

When a voltage is applied between the iridium tip 1 and an extraction electrode 63 by a power source 62, and a high electric field is generated around the apex of the iridium tip 1, the gas molecule 61 drifting around the iridium tip 1 is polarized and attracted to the apex of the iridium tip 1 by the polarizing power. Then, the attracted gas molecule 61 is ionized by the high electric field at the apex of the iridium tip 1.

The generated ion 64 is emitted from an opening 63a of the extraction electrode 63 to a sample (not shown) through an ion optical system (not shown) downstream of the opening. Since the size of a region from which a beam of the ion 64 (ion beam) is emitted, that is, the source size of the ion source is extremely small, this gas field ion source 70 becomes a high brightness ion source and can form an extremely fine focused ion beam on the sample.

Figure 11:
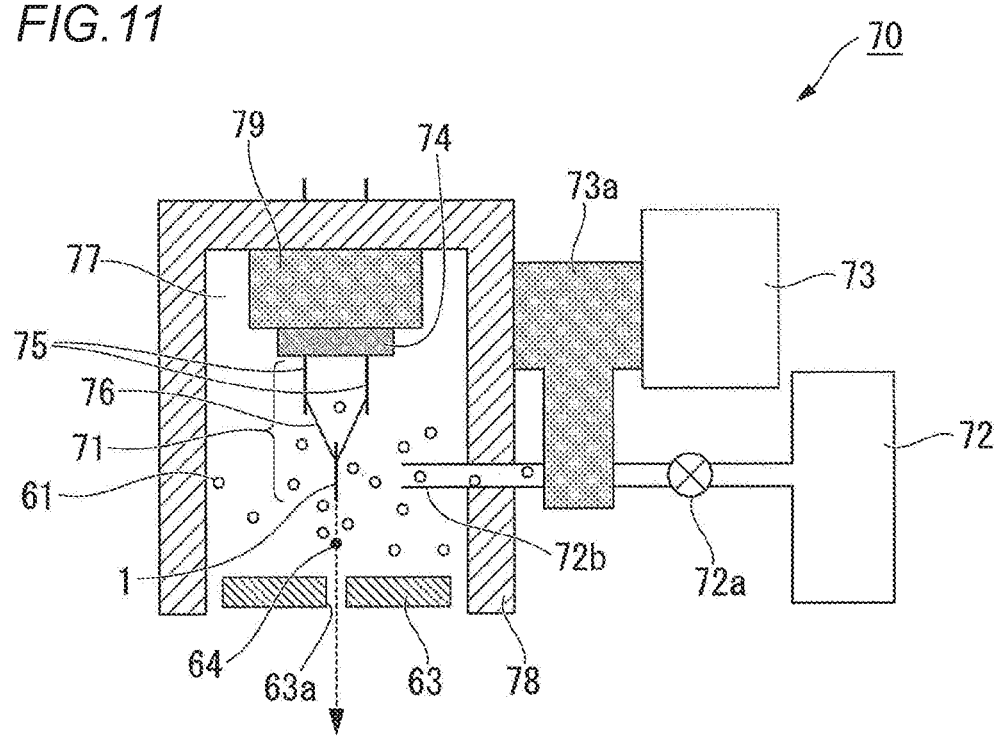
FIG. 11 is a schematic structural view for explaining the structure of the gas field ion source according to an illustrative embodiment of the invention.

Hereinafter, with reference to FIG. 11, the basic structure of the gas field ion source 70 will be described.

The gas field ion source 70 includes a tip structure 71, an ion source gas supply section 72, a cooling device 73, an extraction electrode 63, and an extraction power source section (not shown).

The tip structure 71 includes an insulating base member 74, a pair of conducting pins 75 fixed to the base member 74, a filament 76 composed of a fine wire of tungsten or the like connected between the end portions of the pair of conducting pins 75, and an iridium tip 1 electrically and mechanically fixed to the filament 76. The iridium tip 1 is connected to the filament 76 by spot welding or the like, and emits ions from an apex portion thereof.

The ion source gas supply section 72 can supply a small amount of a gas (for example, helium gas, or the like) including a gas molecule 61 to be ionized to the surroundings of the iridium tip 1, and communicates with an ion source chamber 77 through a gas introduction pipe 72b such that the flow rate can be adjusted by a valve 72a. The species of the gas to be provided in the ion source gas supply section 72 is not limited to one species, and gas cylinders (not shown) of a plurality of gas species may be disposed, and the gases may be supplied to the ion source chamber 77 by changing the species of the gas as needed or by mixing a plurality of gas species.

The extraction electrode 63 is disposed apart from the apex of the iridium tip 1 and includes the opening 63a. The extraction electrode 63 guides ions emitted by the iridium tip 1 to the ion optical system (not shown) downstream of the opening 63a.

The extraction power source (not shown) applies an extraction voltage between the extraction electrode 63 and the iridium tip 1, whereby the gas molecule 61 is ionized at the apex of the iridium tip 1 to generate an ion 64, and extracts the ion 64 to the side of the extraction electrode 63.

The cooling device 73 cools the iridium tip 1 and a gas to be supplied to the ion source chamber 77 from the ion source gas supply section 72 with a cooling medium such as liquid helium or liquid nitrogen. The cooling medium at a low temperature generated by the cooling device 73 comes in contact with the wall surface 78 surrounding the tip structure 71 and the gas introduction pipe 72b through a connection section 73a and cools these members and the inside of the ion source chamber 77.

Incidentally, the cooling device 73 is not limited to this structure, and may have any structure as long as it cools at least the iridium tip 1, and may have a structure including, for example, a cooling block, a freezing machine, or the like. Further, between the ion source chamber 77 and the tip structure 71, a cold head 79 for radiating the heat of the iridium tip 1 is disposed. The cold head 79 is formed into a block shape with alumina, sapphire, or a ceramic material such as aluminum nitride, and fixed to the base member 74.

The iridium tip 1 of this illustrative embodiment is made of iridium, and has a pyramid structure having an apex with <210> orientation and constituted by only a single iridium atom and surrounded by one {100} crystal plane and two {111} crystal planes in a sharpened apex portion of a single crystal with <210> orientation. These crystal planes and the pyramid structure can be confirmed by an FIM image observation in advance.

The gas to be supplied to the ion source chamber 77 from the ion source gas supply section 72, in other words, the raw material gas for forming a focused ion beam may be any rare gas such as helium, neon, argon, krypton, or xenon, or may be a molecular gas such as hydrogen, oxygen, or nitrogen. Further, a mixed gas of any of these gases may be used.

In this illustrative embodiment, as the ion source gas, nitrogen gas is used. In a conventional commercially available gas field ion source, a tungsten tip is used, however, nitrogen gas corrodes (etches) tungsten, and therefore, nitrogen ions are not actively emitted by using a gas containing nitrogen as a main component and emit nitrogen ions. Instead, the conventional gas field ion source is configured such that nitrogen is not left in the ion source chamber 77, and also nitrogen is not mixed in the gas to be supplied from the ion source gas supply section 72, and the use of nitrogen gas is prevented. Further, in the case where the shape of the tip apex is molded, a rare gas such as helium is used as the main component, and just an extremely small amount of nitrogen gas is added to the main component.

According to the iridium tip 1 of this illustrative embodiment, the atom at the apex of the iridium tip 1 is maintained without being detached over a long period of time, and therefore, an ion can be emitted stably for a long period of time. Further, since the atomic arrangement in each pyramid surface of the pyramid structure at the apex of the iridium tip 1 is dense, impurity particles around the iridium tip 1 are hardly adhered to the iridium tip 1, and thus, a focused ion beam with an extremely small variation in current or irradiation position can be formed, and as a result, a focused ion beam apparatus with high performance can be provided. Accordingly, the frequency of the regeneration process for restoring the apex of the iridium tip 1 so as to be constituted by a single atom, which is considered to be required, can be remarkably reduced to reduce the time required for maintenance of the apparatus, and thus, the burden on the users can be greatly reduced.

(Fifth Illustrative Embodiment) Focused Ion Beam Apparatus

This illustrative embodiment is directed to a focused ion beam apparatus including a gas field ion source. The focused ion beam apparatus is also referred to as a scanning ion microscope (SIM), however, an apparatus with which processing (for example, hole formation, section formation, deposition film formation, etc.) and observation of a target sample are mainly performed is referred to as "focused ion beam apparatus", and an apparatus with which observation of the shape of a target sample is exclusively performed is referred to as "scanning ion microscope". Therefore, in the focused ion beam apparatus, an ion species capable of actively performing sputtering a target sample is used, and in the scanning ion microscope, ions of a light element such as hydrogen or helium having a small mass and hardly sputters a target sample are used. However, in both apparatuses, the focusing performance of an ion beam and the long-term stability of ion beam emission are required in common, and the structure of an ion source, an ion beam focusing optical system, a cooling unit, a vacuum exhaust device, etc. is basically the same.

Figure 12:
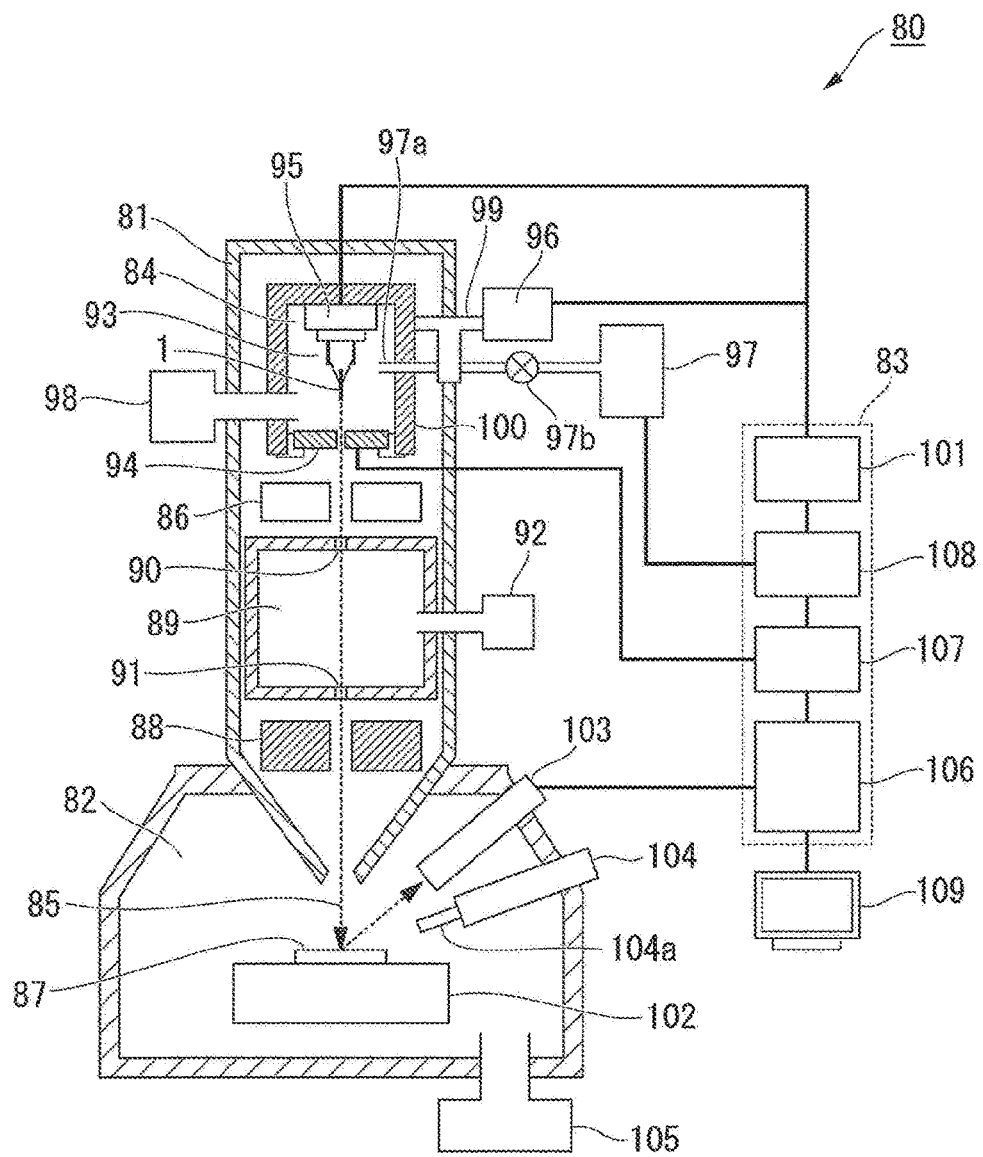
FIG. 12 is a structural view of a focused ion beam apparatus according to an illustrative embodiment of the invention.

FIG. 12 shows a schematic structure of a focused ion beam apparatus 80. The focused ion beam apparatus 80 mainly includes an ion beam column 81, a sample chamber 82, and a control section 83.

The ion beam column 81 includes an ion source chamber 84 including an iridium tip 1 which generates ions, a condenser lens electrode 86 which condenses the ions emitted from the ion source chamber 84 to form a focused ion beam 85, and an objective lens electrode 88 which focuses the focused ion beam 85 on a sample 87.

Further, the ion beam column 81 includes an intermediate chamber 89 between the ion source chamber 84 and the sample chamber 82, and also includes orifices 90 and 91 between the ion source chamber 84 and the intermediate chamber 89 and between the sample chamber 82 and the intermediate chamber 89, respectively. The focused ion beam 85 passes through the orifices 90 and 91, and is irradiated on the sample 87.

The intermediate chamber 89 is connected to a vacuum pump 92 so that the degree of vacuum can be adjusted by the vacuum pump 92, and the intermediate chamber 89 enables differential pumping between the sample chamber 82 and the ion source chamber 84.

The ion source chamber 84 includes the iridium tip 1 and also includes a gas field ion source 93 which emits the focused ion beam 85 and an extraction electrode 94 which forms an electric field for extracting the focused ion beam 85 around the iridium tip 1.

The iridium tip 1 is composed of an iridium single crystal. Incidentally, the iridium tip 1 may be configured such that the surface of a needle-shaped substrate composed of an iridium single crystal is coated with iridium by electroplating, deposition, or the like. The iridium tip 1 includes the pyramid structure according to the above-described third illustrative embodiment in an apex portion.

To the iridium tip 1, a heater 95 is connected. The heater 95 can adjust the temperature of the iridium tip 1, and is used when the surface of the iridium tip 1 is cleaned, when the pyramid structure in an apex portion of the iridium tip 1 is formed, and the like.

Further, to the ion source chamber 84, a cooling device 96 which cools the iridium tip 1, an ion source gas supply section 97 which supplies an ion source gas into the ion source chamber 84, a vacuum pump 98 which brings the ion source chamber 84 to a vacuum state, and the like are connected.

The cooling device 96 cools the iridium tip 1 or an ion source gas to be supplied to the ion source chamber 84 from the ion source gas supply section 97 with a cooling medium such as liquid nitrogen or liquid helium. For example, the cooling device 96 cools the iridium tip 1 and the ion source gas through a connection section 99 for connecting the ion source chamber 84 to the cooling device 96 and through a wall section 100 of the ion source chamber 84.

The ion source gas to be supplied from the ion source gas supply section 97 may be a rare gas such as helium, neon, argon, krypton, or xenon, or may be a molecular gas such as hydrogen, oxygen, or nitrogen. The ion source gas is emitted as an ion from the apex of the iridium tip 1, and the effect of chromatic aberration is suppressed low because the energy distribution width of the focused ion beam 85 is extremely narrow. As compared with, for example, a conventionally known plasma gas ion source or liquid metal ion source, the gas field ion source 93 of this illustrative embodiment serves as an ion source having a high brightness with an extremely small ion generation region. The ion source gas in this illustrative embodiment is nitrogen. Nitrogen is field-ionized at a relatively low field strength (for example, 17 V/nm), however, a foreign substance physically adsorbed on the surface of the iridium tip 1 is detached at a field strength lower than that, and therefore, when nitrogen is ionized, the surface of the iridium tip 1 is brought to a state where a foreign substance is removed.

Further, hydrogen (which is field-ionized at a field strength of about 22 V/nm), helium (which is field-ionized at a field strength of about 44 V/nm), neon (which is field-ionized at a field strength of about 35 V/nm), argon (which is field-ionized at a field strength of about 22 V/nm), and the like are not ionized unless the field strength is higher than that required for field ionization of nitrogen. Accordingly, even if these gases are left in the ion source chamber 84, they are not ionized, and therefore, the nitrogen to be supplied from the ion source gas supply section 97 is not necessarily ultra-high purity nitrogen. Accordingly, the cost required for the operation of the apparatus can be reduced.

Since nitrogen gas is corrosive to a certain type of metal, even if only a small amount of nitrogen is mixed in helium in a gas field ion source using a conventional tungsten tip, the tungsten tip is corroded (etched) and the shape of the tip is deformed, and thus, the apex portion of the tip for emitting ions is damaged. Accordingly, in a conventional gas field ion source using a tungsten tip, even if nitrogen gas is supplied as a main component, it is difficult to realize the generation of a nitrogen ion beam.

Hereinafter, control of the temperature of the iridium tip 1 will be described.

When the temperature of the iridium tip 1 is low, the adsorption density of gas molecules increases. Therefore, by decreasing the temperature of the iridium tip 1, the amount of the current of the focused ion beam 85 can be increased. However, if the temperature of the iridium tip 1 is decreased, depending on the gas species or the cooling temperature, gas molecules are adsorbed on the wall section 100 of the ion source chamber 84 or the connection section 99 for connecting the cooling device 96 to the ion source chamber 84 and solidified in some cases. The solidified gas molecules are vaporized all at once when the temperature of the ion source chamber 84 is increased. Therefore, the gas partial pressure in the ion source chamber 84 may be rapidly increased, the operation of the gas field ion source may become unstable, or electric discharge may occur to damage the apex of the tip.

The cooling temperature of the iridium tip 1 by the temperature control section 101 varies depending on the ion source gas species to be supplied from the ion source gas supply section 97, however, in this illustrative embodiment, the temperature can be set within the range of about 40 K to 200 K. According to this configuration, the ion beam with a current amount required for microprocessing can be stably irradiated.

The focused ion beam of this gas ion enables the observation of the surface of the sample by secondary electrons generated from an irradiated portion (not shown) of the sample 87, and enables the processing (for example, hole formation, section formation, removal of a surface layer, etc.) of the surface of the sample by sputtering of the sample 87 with the ions to be irradiated on the sample 87.

Further, the ion source gas supply section 97 includes a gas storage section (not shown) for storing the ion source gas and a nozzle 97a for supplying the ion source gas around the iridium tip 1, and by providing a highly accurate valve 97b between the nozzle 97a and the ion source gas supply section 97, the ion source gas can be supplied to the apex of the iridium tip 1 while actively adjusting the flow rate.

The vacuum pump 98 is provided for increasing the degree of vacuum in the ion source chamber 84, and in the gas field ion source 93, the degree of vacuum before the ion source gas is supplied is maintained at high vacuum, for example, at about $1 \times 10^{-5}$ to $1 \times 10^{-8}$ Pa.

Further, the ion beam column 81 includes a detector (not shown) for obtaining a Field Ion Microscope (FIM) image for confirming the atomic arrangement at the apex of the iridium tip 1 of the gas field ion source 93. This detector is movable with respect to the ion beam axis, and in the case where the confirmation of an FIM image is not needed, the detector can be moved away from the ion beam axis and made to stand by. This detector enables the confirmation of the atomic arrangement at the apex of the iridium tip 1 as necessary, for example, in the case where an ion current becomes unstable or an observation image is disturbed, and so on.

The sample chamber 82 accommodates a sample stage 102 which moves the sample 87 to an irradiation position of the focused ion beam 85 which is irradiated from the ion beam column 81. The sample stage 102 moves based on a command or the like of an operator, and can be displaced in five axes. That is, the sample stage 102 is supported by a displacement mechanism (not shown) which includes an XYZ axis mechanism (not shown) for moving the sample stage 102 along an X axis, a Y axis, and a Z axis, the X axis and the Y axis being orthogonal to each other within the same plane and the Z axis being orthogonal to both of the X axis and the Y axis, a tilt axis mechanism (not shown) for rotating and tilting the sample stage 102 about the X axis or the Y axis, and a rotating mechanism (not shown) for rotating the sample stage 102 about the Z axis.

The sample chamber 82 further includes a detector 103 which detects secondary ions or secondary electrons generated by scanning irradiation of the focused ion beam 85. According to this configuration, it is possible to form an observation image from a detection signal of the secondary ions or the secondary electrons and a scan signal of the focused ion beam 85. When a reflected ion detector is used as the detector 103, a reflected ion image can be formed by detecting reflected ions generated from the sample 87.

Further, the sample chamber 82 includes a gas supply section 104 which can spray a gas on the sample 87 during irradiation with the focused ion beam 85. The gas supply section 104 includes a gas storage section (not shown) for storing the gas and a nozzle section 104a for spraying the gas around the sample 87. The gas supply section 104 may include a gas flow rate control section (not shown), which controls the flow rate of the gas, such as a mass flow controller. By irradiating the focused ion beam 85 while spraying a deposition gas such as a carbon-based gas or a carbon-based compound gas containing a metal such as platinum or tungsten on an irradiated portion (not shown) of the sample 87 from the gas supply section 104, a deposition film can be formed on the surface of the sample. On the other hand, by irradiating the focused ion beam 85 while spraying a halogen-based etching gas such as an iodine-based etching gas from the gas supply section 104, a foreign substance on the surface of the sample can be selectively removed or processing can be performed at a higher speed than processing by sputtering.

Further, to the sample chamber 82, a vacuum pump 105 which can adjust the degree of vacuum in the sample chamber 82 is connected.

The control section 83 includes an image forming section 106, an extraction voltage control section 107, an ion source gas control section 108, and a temperature control section 101. Further, the control section 83 can control the application of a voltage to a condenser lens electrode (not shown) and an objective lens electrode (not shown), the movement of the sample stage 102, and the like.

The image forming section 106 generates an observation image from a detection signal output from the detector 103, and displays the generated observation image on a display section 109. Therefore, by irradiating the focused ion beam 85 on the sample 87 and allowing the detector 103 to detect the generated secondary ions or secondary electrons, the observation image of the sample 87 is displayed on the display section 109, whereby the image can be brought to an observable state. Further, by allowing the detector 103 to detect the secondary electrons, the aspect of the surface of the sample can be examined, and by allowing the detector 103 to detect the secondary ions, the distribution of elements constituting the sample can be examined.

The extraction voltage control section 107 controls the voltage to be applied to the extraction electrode 94. The extraction voltage control section 107 is used when the ion emission current is adjusted, when the pyramid structure at the apex of the iridium tip 1 is produced or processed, and the like.

The ion source gas control section 108 controls the ion source gas supply section 97 which includes a gas flow rate control section (not shown), which controls the flow rate of the ion source gas, such as a mass flow controller.

The temperature control section 101 can control the cooling device 96 which cools the temperature of the iridium tip 1 or the temperature of the ion source gas, and the heater 95 which is used when the iridium tip 1 is cleaned by heating.

By this focused ion beam apparatus 80, for example, a focused nitrogen ion beam having a diameter of 1 nm or less can be formed. The stability of the focused nitrogen ion beam is as high as, for example, 1%/hour or less, and even if it is continuously operated for, for example, about 30 days, the atom at the apex of the iridium tip 1 is not detached, and therefore, ion emission is not interrupted. Further, it was confirmed by the inventors of the present application that the ion generation position does not vary and the focused nitrogen ion beam is continuously formed. This is a far longer lifetime than the continuous operation for about 2,250 seconds (at most 40 minutes) described in the above document, William B. Thompson et al., Proceedings of the 28th Annual LSI Testing Symposium (LSITS 2008), (2008) pp. 249-254, "Helium Ion Microscope for Semiconductor Device Imaging and Failure Analysis Applications". Accordingly, the focused ion beam apparatus 80 which can visualize the surface state or the elemental distribution at high resolution and has a long lifetime and is highly stable can be provided. In a commercially available focused ion beam apparatus using a conventional gas field ion source, since helium ions are used, the mass of the ions is very light, and therefore, the surface of a sample can be hardly processed. On the other hand, by the focused ion beam apparatus 80 using nitrogen gas according to this illustrative embodiment, it becomes possible to process the surface of a sample, and owing to its focusing performance, further finer local processing can be achieved even in comparison with the conventional commercially available focused ion beam apparatus.

In the fifth illustrative embodiment, the focused ion beam apparatus 80 is described, however, a multi-beam apparatus (an ion-electron multi-beam apparatus) in which a column of a scanning electron microscope is mounted on this focused ion beam apparatus 80 and disposed so that the focused ion beam 85 and an electron beam are irradiated on substantially the same position on the surface of a sample may be configured.

Further, this scanning electron microscope may be an electron microscope (described in a sixth illustrative embodiment later) including an electron source having an iridium tip 1, and a high-definition image can be obtained by a focused ion beam and an electron beam.

Further, a secondary ion detector is mounted on the above-described focused ion beam apparatus 80, and by analyzing secondary ions generated from an irradiated portion (not shown) of a sample, an element constituting the irradiated portion can also be identified. For example, by scanning a certain region with a focused ion beam and performing an elemental analysis, a map of a specific element can be created. On the other hand, in an analysis of secondary ions using a conventional focused gallium ion beam apparatus, a problem arises that gallium implanted in a sample is also detected, and cannot be distinguished from gallium originally contained in the sample. Further, the focused ion beam apparatus 80 of this illustrative embodiment has favorable focusing performance of a beam as compared with the conventional focused gallium ion beam apparatus, and it is possible to perform an elemental analysis in a further minute region.

(Sixth Illustrative Embodiment) Electron Microscope

An electron microscope is largely divided into a scanning electron microscope (SEM), a transmission electron microscope (TEM), a scanning transmission electron microscope (STEM), and the like. These electron microscopes are in common in that electrons generated from an electron source are formed into a beam and irradiated on a sample. A scanning electron microscope forms an image with secondary electrons generated from a region irradiated with a focused electron beam. A transmission electron microscope irradiates a focused electron beam on a thin film-shaped sample, magnifies the electron beam transmitted through the thin film sample, and forms an image. In general, by the transmission electron microscope, a higher magnification observation can be achieved as compared with a scanning electron microscope. In a scanning transmission electron microscope, a magnified image of a minute region is obtained by scanning a thin film-shaped sample with a focused electron beam, and magnifying an image transmitted through the thin film sample. These electron microscopes are required to form a high magnification and high resolution image. Conventionally, there has been known a technique in which an electron source having an apex constituted by only a single atom is used for increasing the resolution of an image to be obtained, however, this technique has a problem that desired stability and lifetime (for example, a time for which the microscope can be continuously used without performing a regeneration process for the apex of the tip) cannot be ensured.

In this illustrative embodiment, the iridium tip 1 according to the first illustrative embodiment is used as an electron source of the scanning electron microscope. The electron source is configured such that in addition to having the same structure as that of the tip structure 71 of the gas field ion source 70 in the seventh illustrative embodiment shown in FIG. 11, a filament 76 is heated by a current introduced from a pair of conducting pins 75 so that the iridium tip 1 can be cleaned by heating, and also processes such as formation and regeneration of a pyramid structure can be performed, and the electron source is detachably mounted on various electron microscopes.

The degree of vacuum in an electron source chamber (corresponding to the ion source chamber 77 shown in FIG. 11) including the iridium tip 1 is set to, for example, about $10^{-9}$ Pa so as to bring the inside of the chamber to an ultrahigh vacuum state. The resolution of an SEM image of the scanning electron microscope of this illustrative embodiment is below 1 nm, and therefore far surpasses that of the conventional SEM.

When the scanning electron microscope of this illustrative embodiment is operated for a long period of time, a variation in emitted electron beam current caused by adsorption of impurity atoms or molecules left in the apparatus including the electron source on the iridium tip 1 is sufficiently smaller than in the case of the conventional electron source.

Incidentally, the scanning electron microscope is described in this illustrative embodiment, however, even if the electron source according to this illustrative embodiment is mounted on a transmission electron microscope (TEM) and a scanning transmission electron microscope (STEM), the same effect as described above can be achieved. Further, by mounting an energy dispersive X-ray spectrometer on each electron microscope of this illustrative embodiment and performing an elemental analysis in a region irradiated with an electron beam, high resolution measurement data can be obtained.

Further, the electron source according to this illustrative embodiment can also be used as an electron source of an electron beam applied analysis apparatus such as an electron beam microanalyzer or an Auger electron spectrometer. The electron beam microanalyzer is an apparatus for analyzing constituent elements based on the wavelength and intensity of a specific X-ray generated by irradiation of a target substance with an electron beam. Further, the Auger electron spectrometer is an apparatus for identifying and quantitatively determining an element by measuring an energy distribution of Auger electrons generated by irradiation of a target substance with an electron beam. In both apparatuses, the narrowness of the electron beam to be irradiated increases the analysis resolution, and the long-term and high stability of the electron beam emission improves the reliability of the analysis data, and therefore, by using the electron source according to this illustrative embodiment, these effects can be achieved.

(Seventh Illustrative Embodiment) Scanning Probe Microscope

This illustrative embodiment relates to a scanning probe microscope including the iridium tip 1 produced by the iridium tip production method described in detail in the above second illustrative embodiment.

The scanning probe microscope (SPM) is a microscope for magnifying and observing the surface shape or state of a sample by scanning the surface of the sample with a sharpened probe such that the probe traces the surface, and one using a tunneling current flowing between the probe and the sample is called "scanning tunneling microscope (STM) ", and one using an atomic force between the probe and the sample is called "atomic force microscope (AFM)".

In these scanning probe microscopes, it is preferred that the apex of the probe is constituted by a single atom from the viewpoint of observation resolution. Even if the probe immediately after production is terminated with a single atom, by repeatedly using the probe, the atom at the apex is detached to deteriorate the observation resolution, or the number of atoms at the apex is increased to more than one to frequently change the detecting atom, and therefore, a desired analysis result cannot be obtained. Accordingly, a scanning probe microscope including a probe capable of maintaining a state where the apex is constituted by a single atom for a long period of time so as to have high resolution and long lifetime has been demanded.

Conventionally, the probe of the scanning probe microscope is made of silicon or tungsten, however, in this illustrative embodiment, the iridium tip 1 terminated with a single atom produced by the iridium tip production method according to the above second illustrative embodiment is used. Iridium originally has high chemical resistance, and due to the superiority that the end terminated with a single atom is maintained for a long period of time, which is the advantageous effect, even in the case where the scanning probe microscope is operated in the atmosphere, a long lifetime and a high resolution observation result can be obtained.

Further, in the case where impurities in the atmosphere are adhered to the probe and the observation resolution is deteriorated, the probe is mounted on the iridium tip production apparatus 20 according to the above first illustrative embodiment, and heated therein, whereby the adhered impurities can be removed. At this time, in order to confirm the state of the atom at the apex, the pattern of the apex of the tip may be confirmed with an FIM image. If the atom at the tip end is detached, by the iridium tip production method according to the above second illustrative embodiment, the tip may be regenerated so that the apex is terminated with a single atom.

(Eighth Illustrative Embodiment) Photomask Repair Apparatus

A mask repair apparatus 300 including the gas field ion source 70 according to the above fourth illustrative embodiment will be described.

The mask repair apparatus 300 of this illustrative embodiment repairs a defect in a photomask to be used in a pattern exposure apparatus (not shown) when producing a semiconductor device or the like.

Conventionally, there has been known a mask repair apparatus using a focused gallium ion beam or an electron beam. Processing using a focused gallium ion beam enables etching of various materials by a sputtering effect. However, when a gallium ion is implanted in a region of a photomask where light is to be transmitted, a problem arises that the light transmittance is decreased. Further, the focused gallium ion beam has a problem that it is difficult to obtain a minimum processing dimension required for repairing a photomask with an ultra-fine dimension.

On the other hand, for example, as a technique for repairing a photomask using an electron beam disclosed in JP2003-218161A, a photomask repair apparatus using an electron beam and an assist gas can ensure a minimum processing dimension required for repairing a photomask with an ultra-fine dimension without decreasing the light transmittance of a beam-irradiated region. In recent years, with respect to a photomask using molybdenum silicide (MoSi) in a light shielding film, several proposals of the light shielding film having enhanced resistance to damage caused by light exposure or cleaning have been made. However, the composition of such a light shielding film is close to the composition of a base glass substrate, and therefore, there is no assist gas which causes a difference in etching speed between the light shielding film and the base glass substrate. Therefore, a problem arises that it is difficult to stop etching at the boundary surface between the light shielding film and the base glass substrate.

On the other hand, by using the mask repair apparatus including the gas field ion source, it is possible to change from an ion source gas having a large mass to an ion source gas having a small mass in the same apparatus. That is, if the mass of the irradiation ion species is large, processing and observation with characteristics similar to those in the case where a focused gallium ion beam is used can be performed, and if the mass of the irradiation ion species is small, processing and observation with characteristics similar to those in the case where an electron beam is used can be performed. The mass of the irradiation ion species can be selected according to the processing purpose or the like.

For example, in the case where the above-described light shielding film is removed, when a beam of ions of a light element such as hydrogen or helium is used, since such a beam does not have a sputtering effect, an assist gas is used, however, in the same manner as an electron beam, the light shielding film and the base glass substrate have substantially the same composition, and therefore, there is no great difference in etching speed. On the other hand, when a beam of ions of a little heavier element such as nitrogen or neon is used, since such a beam has a sputtering effect, a difference in the structure between the light shielding film and the base glass substrate makes a difference in etching speed. When a further heavier element such as argon, krypton, or xenon is used, a problem arises that the light transmittance is decreased due to implantation of ions. Therefore, ions of a little heavier element such as nitrogen or neon are most suitable for use in repairing a photomask adopting the above-described light shielding film.

The speed of processing with an ion beam is in proportion to an ion emission current, however, the ion emission current of a gas field ion source is lower by several digits than that of a focused gallium ion beam. That is, the processing speed is extremely slow, and therefore, an ion emission current which is as large as possible is required to be ensured. In the case where an ion emission current is increased by merely increasing a raw material gas pressure, electric discharge is induced at the tip apex, so that the tip apex may be damaged. Accordingly, it is desired to use the raw material gas which is easily ionized at a low gas pressure. Here, the ionization efficiency of nitrogen is higher than that of neon, and therefore, at the same gas pressure, a high ion emission current is more easily obtained by a nitrogen beam than by a neon beam, and it has been found by the inventors of the present application that a focused nitrogen ion beam is most suitable for use in repairing a photomask.

Figure 13:
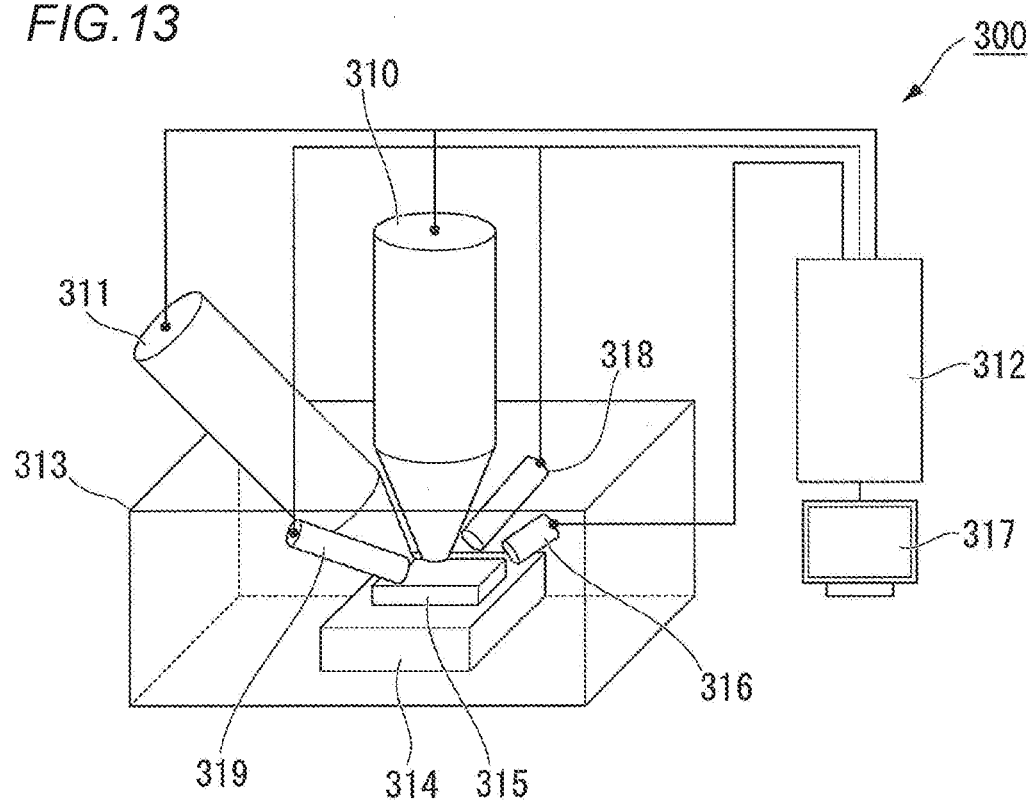
FIG. 13 is an explanatory view showing a schematic structure of a mask repair apparatus according to an illustrative embodiment of the invention.

As shown in FIG. 13, the mask repair apparatus 300 according to this illustrative embodiment includes an ion beam column 310, an electron beam column 311, a control section 312, and a sample chamber 313.

Hereinafter, a method for repairing a photomask having a defect will be described.

First, the mask repair apparatus 300 includes a detector 316 which irradiates a photomask 315 placed on a sample stage 314 in the sample chamber 313 with a nitrogen ion beam from the ion beam column 310 and detects secondary electrons or secondary ions generated from the irradiated portion, and a monitor 317 capable of displaying a result detected by the detector 316 as an observation image. Further, the mask repair apparatus 300 includes the electron beam column 311 which emits electrons for neutralizing the electric charge generated by irradiation with an ion beam. Incidentally, the monitor 317 can also display various control values.

The mask repair apparatus 300 includes a deposition gas supply section 318 and an etching gas supply section 319.

The deposition gas supply section 318 can supply a gas for deposition on the photomask 315, and by irradiating a deposition gas such as a carbon-based gas or a silane-based gas or a carbon-based compound gas containing a metal such as tungsten while irradiating an ion beam, various films of carbon, silicon oxide, tungsten, and the like can be formed on the photomask 315.

The etching gas supply section 319 can supply a halogen-based gas for etching such as an iodine-based gas for etching to a defect in the photomask, and by irradiating a nitrogen ion beam while supplying the gas for etching, high speed processing can be performed as compared with the case where the gas for etching is not introduced or selective processing of only a desired material can be performed.

Figure 14:
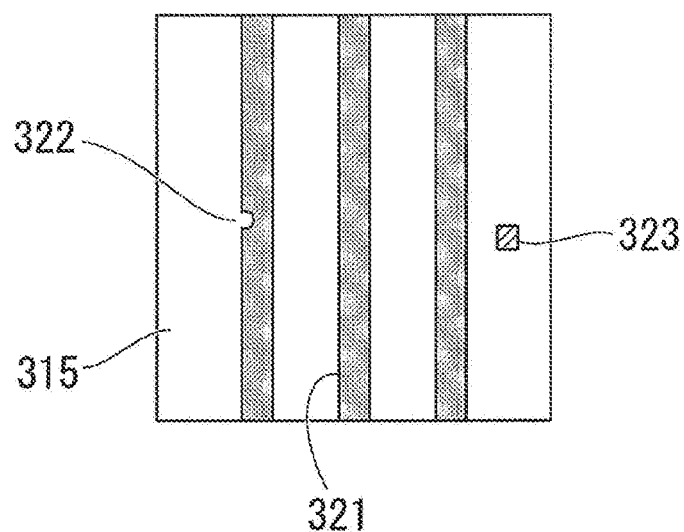
FIG. 14 is a view for explaining a pattern to be repaired by the mask repair apparatus according to the illustrative embodiment of the invention.

A mask repair method using the mask repair apparatus 300 will be described with reference to a secondary electron observation image by a nitrogen ion beam of the photomask 315 shown in FIG. 14.

The photomask 315 has a light shielding pattern 321. There are a defect of a pattern missing portion 322 in a part of the light shielding pattern 321, and a defect of an unnecessary pattern 323. Such a defect can be detected by comparing the original design information of the photomask with the secondary electron observation image of the surface of the photomask after completion of formation, or by comparing the secondary electron observation image of a region suspected to have a defect with the secondary electron observation image of a normal region. The coordinate information of the location of the defect, the type of defect, the image information of the defect, and the like can be stored in the control section 312 of the mask repair apparatus 300 or are used for obtaining information from an external information apparatus.

Further, the mask repair apparatus 300 performs calculation for an optimum repair method for bringing the photomask after repair to a state equivalent to that of the normal region in consideration of the location and size of the defect, whether the defect form is a missing defect or an unnecessary pattern defect, and so on, and can control the ion beam column 310, the electron beam column 311, the deposition gas supply section 318, and the etching gas supply section 319 based on the calculation result.

Further, for the missing portion 322 present in the photomask 315, the mask repair apparatus 300 can fill the missing portion 322 by irradiating a nitrogen ion beam from the ion beam column 310 while spraying an appropriate gas for deposition from the deposition gas supply section 318.

Further, for the unnecessary pattern 323 present in the photomask 315, the mask repair apparatus 300 can remove the unnecessary pattern 323 by etching by irradiating a nitrogen ion beam from the ion beam column 310 while spraying a gas for etching from the etching gas supply section 319. Incidentally, a heavy ion which decreases the light transmittance of a region of the photomask 315 where light is to be transmitted is not implanted.

Accordingly, the photomask 315 is brought to a state where a pattern can be transferred normally without transferring a defect even if the photomask is exposed to light. That is, the mask repair apparatus 300 can repair and normalize the photomask 315.

The mask repair apparatus 300 enables the confirmation of the repair performance after completion of the repair processing by storing a secondary electron observation image of a region after repairing in association with a secondary electron observation image before repairing or a secondary electron observation image of a normal region in the control section 312 or the external information apparatus. Incidentally, the mask repair apparatus 300 can automatically perform such a series of operations.

That is, the mask repair apparatus 300 of this illustrative embodiment capable of forming a focused nitrogen ion beam by the gas field ion source 70 having the iridium tip 1 of the third illustrative embodiment described above does not exist in the prior art, and according to this mask repair apparatus 300, ion implantation, which decreases the light transmittance of a region of the photomask 315 where light is to be transmitted, does not occur, and further finer processing can be achieved in comparison with the conventional mask repair using a focused gallium ion beam.

Further, in comparison with the conventional mask repair using an electron beam, this illustrative embodiment can be appropriately applied also to a light shielding film having a composition close to that of a base glass substrate, and therefore, the choices of the mask material which can be repaired can be increased.

Further, in comparison with the conventional mask repair using a helium field ion source, according to this illustrative embodiment, the processing speed can be improved while maintaining an equivalent minimum processing dimension, and therefore, the choices of the mask material which can be repaired can be increased. Moreover, the gas field ion source 70 itself uses the iridium tip 1 of the third illustrative embodiment described above, and therefore, stable beam formation can be performed over a long period of time, and at the same time, stable and highly accurate mask repair can be performed over a long period of time.

While the present invention has been shown and described with reference to certain illustrative embodiments thereof, it will be understood by those skilled in the art that various changes in form and details may be made therein without departing from the spirit and scope of the invention as defined by the appended claims.

What is claimed is:

1. A gas field ion source comprising:
   an iridium tip comprising a pyramid structure, wherein an apex portion of the pyramid structure has an apex with <210> orientation surrounded by one {100} crystal plane and two {111} crystal planes,
   wherein the pyramid structure includes a first layer composed of a single iridium atom constituting the apex of the pyramid structure, a second layer immediately below the first layer and composed of three iridium atoms located at vertices of a triangle, and a third layer immediately below the second layer and composed of six iridium atoms located at vertices and sides of a triangle,
   wherein the crystal planes of the pyramid structure are defined by the iridium atoms of the first, second, and third layer, and
   wherein the iridium tip is an emitter which is configured to emit an ion beam;
   an ion source chamber which accommodates the emitter;
   a gas supply section which is configured to supply a gas to be ionized, to the ion source chamber;
   an extraction electrode which is configured to ionize the gas to generate ions of the gas and apply a voltage for extracting the ions of the gas from the emitter; and
   a temperature control section which is configured to cool the emitter.

2. The gas field ion source according to claim 1, wherein a main component of the gas is at least any one of hydrogen, nitrogen, oxygen, helium, neon, argon, krypton, and xenon, or a mixture of at least any of these gases.

3. The gas field ion source according to claim 1, wherein a main component of the gas is nitrogen.

4. The gas field ion source according to claim 3, wherein a purity of nitrogen which is the main component of the gas is 99% or more.

5. A focused ion beam apparatus comprising:
   the gas field ion source according to claim 1; and
   a control section which is configured to form a focused ion beam with the ions of the gas generated in the gas field ion source and irradiate a sample with the focused ion beam so as to perform at least one of observation, processing and analysis on an irradiated region of the sample.

6. An ion-electron multi-beam apparatus comprising:
   the gas field ion source according to claim 1; and
   a control section which is configured to irradiate substantially same position on a sample with a focused ion beam and an electron beam,
   wherein the focused ion beam is obtained from the gas field ion source.

7. An ion-electron multi-beam apparatus comprising:
   an electron source having:
      an iridium tip as a tip which is configured to emit electrons, the iridium tip comprising a pyramid structure wherein an apex portion of the pyramid structure has an apex with <210> orientation surrounded by one {100} crystal plane and two {111} crystal planes,
      wherein the pyramid structure includes a first layer composed of a single iridium atom constituting the apex of the pyramid structure, a second layer immediately below the first layer and composed of three iridium atoms located at vertices of a triangle, and a third layer immediately below the second layer and composed of six iridium atoms located at vertices and sides of a triangle, and
      wherein the crystal planes of the pyramid structure are defined by the iridium atoms of the first, second, and third layer; and
      an extraction electrode which is configured to generate the electrons and apply a voltage for extracting the electrons from the iridium tip; and
   a control section which is configured to irradiate substantially same position on a sample with a focused ion beam and an electron beam,
   wherein the electron beam is obtained from the electron source.

8. A scanning probe microscope comprising:
   an iridium tip as a probe, the iridium tip comprising a pyramid structure wherein an apex portion of the pyramid structure has an apex with <210> orientation surrounded by one {100} crystal plane and two {111} crystal planes,
   wherein the pyramid structure includes a first layer composed of a single iridium atom constituting the apex of the pyramid structure, a second layer immediately below the first layer and composed of three iridium atoms located at vertices of a triangle, and a third layer immediately below the second layer and composed of six iridium atoms located at vertices and sides of a triangle, and
   wherein the crystal planes of the pyramid structure are defined by the iridium atoms of the first, second, and third layer; and
   a control section which is configured to measure a shape and a state at an atomic level of a surface of a sample by scanning the probe in a state where the probe is brought close to the surface of the sample.

9. The scanning probe microscope according to claim 8, wherein the scanning probe microscope is at least one of a scanning tunneling microscope and a scanning atomic force microscope.

10. A mask repair apparatus comprising:
   the gas field ion source according to claim 1; and
   a control section which is configured to form a focused ion beam with the ions of the gas generated in the gas field ion source so as to repair a defective part of a photomask by the focused ion beam.

11. The mask repair apparatus according to claim 10, wherein the focused ion beam is a nitrogen ion beam.

\* \* \* \* \*